United States Patent
Zhang et al.

(10) Patent No.: US 12,232,332 B2
(45) Date of Patent: Feb. 18, 2025

(54) INTEGRATED SENSING AND MACHINE LEARNING PROCESSING DEVICES

(71) Applicant: TetraMem Inc., Fremont, CA (US)

(72) Inventors: Minxian Zhang, Amherst, MA (US); Ning Ge, Danville, CA (US)

(73) Assignee: TetraMem Inc., Fremont, CA (US)

(*) Notice: Subject to any disclaimer, the term of this patent is extended or adjusted under 35 U.S.C. 154(b) by 9 days.

(21) Appl. No.: 18/052,071

(22) Filed: Nov. 2, 2022

(65) Prior Publication Data
US 2024/0099023 A1 Mar. 21, 2024

Related U.S. Application Data

(63) Continuation-in-part of application No. 17/932,432, filed on Sep. 15, 2022.

(51) Int. Cl.
*H10B 63/00* (2023.01)
*H04N 23/80* (2023.01)
*H04N 25/78* (2023.01)

(52) U.S. Cl.
CPC .......... *H10B 63/30* (2023.02); *H04N 23/80* (2023.01); *H04N 25/78* (2023.01); *H10B 63/80* (2023.02)

(58) Field of Classification Search
CPC ........ H10B 63/30; H10B 63/80; H04N 23/80; H04N 25/78; H04N 25/79; H01L 27/14627; H01L 27/14634; H01L 27/14636
See application file for complete search history.

(56) References Cited

U.S. PATENT DOCUMENTS

| | | | |
|---|---|---|---|
| 10,970,441 B1* | 4/2021 | Zhang | G06N 3/063 |
| 11,320,558 B2 | 5/2022 | Roberts | |
| 11,320,588 B1* | 5/2022 | Mazed | G16H 10/40 |
| 2006/0115157 A1 | 6/2006 | Mori et al. | |
| 2016/0372449 A1 | 12/2016 | Rusu et al. | |
| 2017/0023492 A1 | 1/2017 | Olsson et al. | |

(Continued)

FOREIGN PATENT DOCUMENTS

| | | | | |
|---|---|---|---|---|
| CN | 109298528 A | | 2/2019 | |
| CN | 110572593 B | * | 3/2022 | ............. H04N 5/374 |
| TW | 202113676 A | | 4/2021 | |

OTHER PUBLICATIONS

International Searching Authority (ISA)/US, International Search Report for PCT/US23/74283, mailed Jan. 2, 2024, 2 pages.

(Continued)

*Primary Examiner* — Ahmed A Berhan
(74) *Attorney, Agent, or Firm* — Jaffery Watson Hamilton & DeSanctis LLP

(57) ABSTRACT

The present disclosure provides for a semiconductor device with integrated sensing and processing functionalities. The semiconductor device includes a sensing module configured to generate a plurality of analog sensing signals; and a machine learning (ML) processor. The sensing module and the ML processor are fabricated on a single wafer. The ML processor includes crossbar arrays that processes the analog sensing signals to generate analog preprocessed sensing data; an analog-to-digital converter (ADC) to convert the analog preprocessed sensing data into digital preprocessed sensing data; and a machine learning processing unit to process the digital preprocessed sensing data utilizing one or more machine learning model.

19 Claims, 20 Drawing Sheets

(56) References Cited

U.S. PATENT DOCUMENTS

| | | | |
|---|---|---|---|
| 2017/0176344 A9 | 6/2017 | Olsson et al. | |
| 2018/0136449 A1 | 7/2018 | Reed | |
| 2018/0190615 A1 | 7/2018 | Pan | |
| 2019/0340314 A1 | 11/2019 | Boesch et al. | |
| 2020/0307995 A1* | 10/2020 | Ghosh | G11C 13/004 |
| 2022/0189941 A1 | 6/2022 | Enquist et al. | |
| 2022/0246652 A1* | 8/2022 | Oguro | B60W 30/09 |

OTHER PUBLICATIONS

International Searching Authority (ISA)/US, International Search Report for PCT/US23/74284, Jan. 2, 2024, 2 pages.
International Searching Authority (ISA)/US, Written Opinion for PCT/US23/74283, mailed Jan. 2, 2024, 6 pages.
International Searching Authority (ISA)/US, Written Opinion for PCT/US23/74284, Jan. 2, 2024, 6 pages.

* cited by examiner

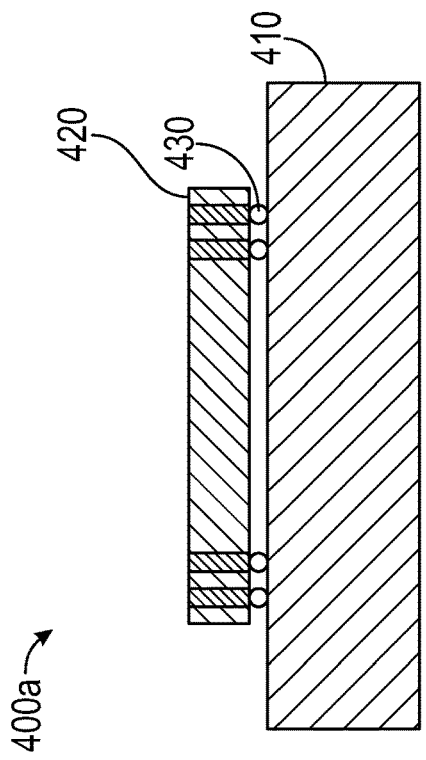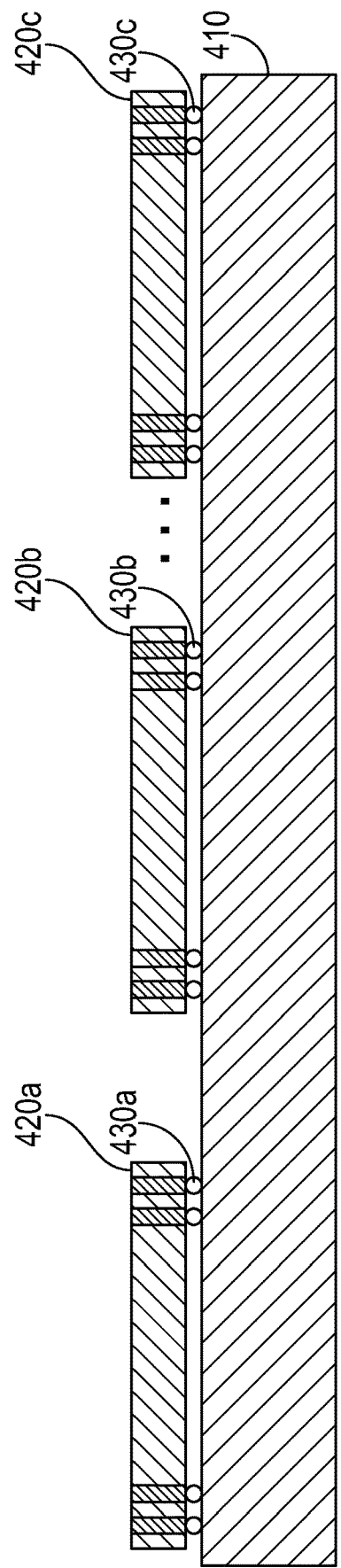
FIG. 4A
FIG. 4B

800c

800d

INTEGRATED SENSING AND MACHINE LEARNING PROCESSING DEVICES

CROSS-REFERENCE TO RELATED APPLICATIONS

The present application is a continuation-in-part of U.S. patent application Ser. No. 17/932,432, entitled "Integrated Sensing and Machine Learning Processing Devices," filed Sep. 15, 2022, which is incorporated herein by reference in its entirety.

TECHNICAL FIELD

The implementations of the disclosure relate generally to computing devices and, more specifically, to integrated sensing and machine learning processing devices.

BACKGROUND

Machine learning (ML) is widely used for face recognition, speech recognition, natural language processing, image processing, etc. ML typically involves analyzing large amounts of sensing data based on complex machine-learning models. Conventional edge devices (local devices close to the sensors gathering the sensing data) lack the computational capabilities for performing such analysis. As a result, the sensing data generated by the sensors may have to be digitalized and transmitted to a remote computing device (e.g., a data center) with ML capabilities for processing. This may involve digitalizing large amounts of data and may require advanced communications capabilities and a large amount of energy and time to transfer the digitalized sensing data. Transferring raw sensing data from the sensors to a remote device may raise privacy concerns, while encrypting the raw sensing data for secure data transfer may further increase the computational costs required by ML. Furthermore, some applications (e.g., medical applications utilizing ML) may require real-time data processing. Accordingly, it might be desirable to run machine learning models locally on edge devices. However, conventional edge devices fail to provide integrated sensing and processing capabilities for locally extracting information and features from analog sensing data provided by the local sensors and performing ML processing.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

According to one or more aspects of the present disclosure, a semiconductor device that may function as an integrated sensing and machine learning processing device is provided. The semiconductor device may include a sensing module configured to generate a plurality of analog sensing signals; and a machine learning (ML) processor. The ML processor may include one or more crossbar arrays configured to process the analog sensing signals to generate analog preprocessed sensing data; an analog-to-digital converter (ADC) configured to convert the analog preprocessed sensing data into digital preprocessed sensing data; and a machine learning processing unit configured to process the digital preprocessed sensing data utilizing one or more machine learning models. The sensing module and the ML processor are fabricated on a single wafer.

In some embodiments, the sensing module and the ML processor are fabricated on the same side of the wafer.

In some embodiments, the sensing module is fabricated on a first portion of wafer, and the ML processor is fabricated on a second portion of the wafer that surrounds the first portion of the wafer.

In some embodiments, a plurality of transistors of the ML processor and a plurality of sensors of the sensing module are fabricated on a substrate of the wafer. The semiconductor device further includes a plurality of interconnect layers fabricated on the plurality of transistors and the plurality of photodiodes.

In some embodiments, a first metal via, a second metallic via, and a third metallic via of a first interconnect layer are connected to a source region, a gate region, and a drain region of a first transistor of the plurality of the transistors, respectively. In some embodiments, a fourth metallic via and a fifth metallic via of the first interconnect layer are connected to a first photodiode of the plurality of photodiodes.

In some embodiments, an RRAM device of the ML processor is fabricated on a metallic pad or metallic via of an interconnect layer of the interconnect layers. In some embodiments, the RRAM device is connected to the first transistor through the first interconnect layer.

In some embodiments, the sensing module comprises a set of micro lenses and a set of color filters. The micro lenses and the color filters of the sensing module are fabricated on the plurality of interconnect layers.

In some embodiments, the sensing module is fabricated on the ML processor.

In some embodiments, the sensing module and the ML processor are fabricated on different sides of the wafer.

In some embodiments, the sensing module includes an array of image sensors. The plurality of analog sensing signals includes a plurality of analog image signals.

In some embodiments, the analog preprocessed sensing data correspond to a plurality of features extracted from the analog sensing signals. The machine learning processing unit performs machine learning using the extracted features.

In some embodiments, the semiconductor device further includes a packaging substrate, wherein the wafer is connected to the packaging substrate through an interconnect layer.

In some embodiments, the ML processor is powered by utilizing the analog sensing signals.

In some embodiments, the semiconductor device further includes a transceiver configured to: transmit, to a computing device, a predictive output generated by the machine learning processing unit based on the one or more machine learning models; and receive, from the computing device, instructions for performing operations based on the predictive output.

In some embodiments, the analog preprocessed sensing data represents a convolution of the analog sensing signals and a kernel.

In some embodiments, conductance values of a plurality cross-point devices of the one or more crossbar arrays are programmed to values representing the kernel.

In some embodiments, the sensing module includes a two-dimensional sensor array, wherein a plurality of cross-point devices of the one or more crossbar arrays is configured to receive the analog sensing signals produced by the two-dimensional sensor array as input.

In some embodiments, the one or more crossbar arrays include a plurality of crossbar arrays positioned on a plurality of different planes.

According to one or more aspects of the present disclosure, a semiconductor device includes: a sensing module configured to generate a plurality of analog sensing signals; and a machine learning processor configured to produce a predictive output by processing the analog sensing signals using one or more machine learning models. The machine learning processor includes: a plurality of crossbar arrays configured to generate a plurality of analog outputs representative of the predictive output; and an analog-to-digital convert unit configured to convert the plurality of analog outputs representative of the predictive output into a plurality of digital signals representative of the predictive output, wherein the sensing module and the ML processor are fabricated on a wafer.

In some embodiments, the semiconductor device further includes a packaging substrate, wherein the wafer is connected to the packaging substrate through an interconnect layer.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding.

FIGS. 4A and 4B are schematic diagrams illustrating example semiconductor devices that can function as a machine learning processor in accordance with some embodiments of the present disclosure.

DETAILED DESCRIPTION

Figure 1A:
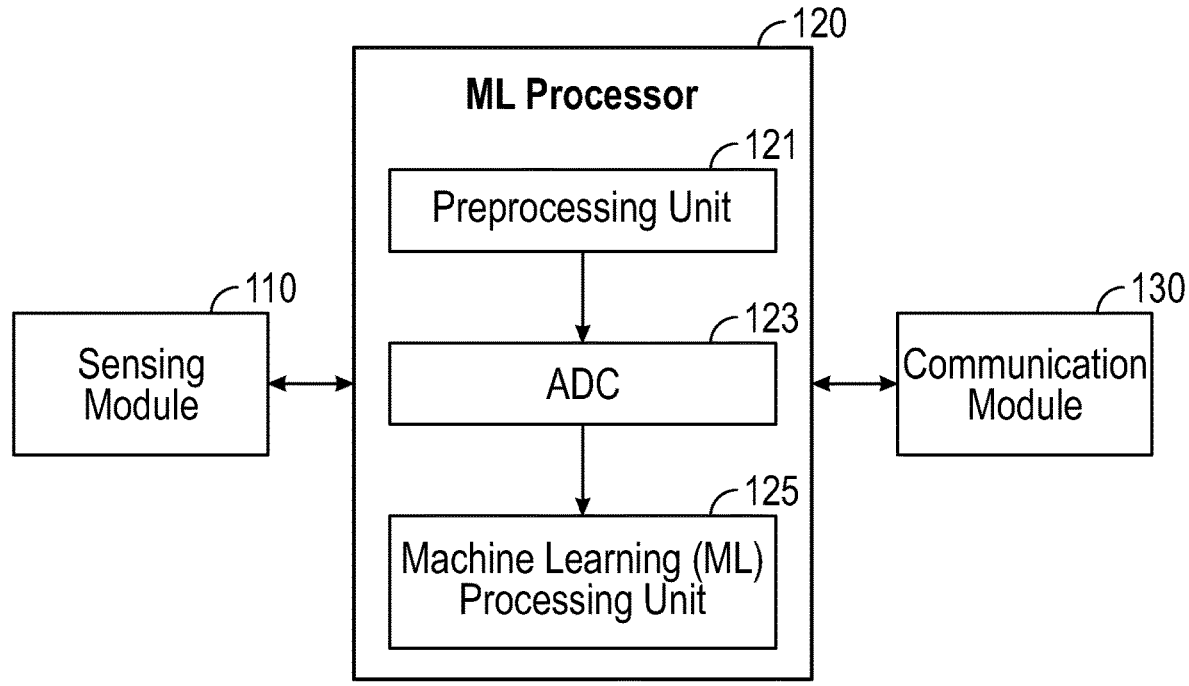
FIGS. 1A and 1B are schematic diagrams illustrating examples of processing devices with integrated sensing and processing capabilities in accordance with some embodiments of the present disclosure.

Aspects of the disclosure provide processing devices with integrated sensing and machine learning capabilities and methods for manufacturing the same. A processing device according to the present disclosure may include a sensing module and a machine learning (ML) processor integrated into the same semiconductor device utilizing three-dimensional (3D) chiplet integration or monolithic 3D integration. The sensing module may include sensor arrays that may produce analog sensing data (e.g., analog image signals produced by image sensors). The ML processor may process the analog sensing data using one or more machine learning models.

In one implementation, the ML processor may include a preprocessing unit that may preprocess the analog sensing data for ML processing, for example, by performing feature extraction, dimension reduction, image processing, etc. The preprocessing unit may include one or more crossbar arrays that may preprocess the analog sensing data in the analog domain. Each of the crossbar arrays may be a circuit structure with interconnecting electrically conductive lines sandwiching a resistive switching material at their intersections. The resistive switching material may include, for example, a memristor (also referred to as resistive random-access memory (RRAM or ReRAM)). The analog sensing data may be provided to the crossbar arrays as input signals. The crossbar arrays may produce analog output signals representative of the preprocessed sensing data. The analog output signals may then be converted into digital signals representative of the preprocessed sensing data and used for subsequent machine learning processing by the ML processor. By preprocessing the analog sensing data in the analog domain and digitizing the preprocessed sensing data instead of the raw sensing data, the ML processor described herein may enable significant data reduction as only a small amount of information (e.g., the preprocessed sensing data) will be digitalized and transmitted from the sensing module at the edge to the next layer of the network.

In another implementation, the ML processor may run a machine learning model on the analog sensing data and may generate analog signals representative of a predictive output of the ML processing (e.g., a classification result, a label assigned to the analog sensing data, outputs of a layer of a neural network, a decision made based on the ML models, etc.). For example, the ML processor may implement a multi-layer neural network utilizing crossbar arrays. The analog output signals produced by the crossbar arrays may represent the predictive output and may be converted into digital outputs and transmitted to another computing device.

In some embodiments, the processing device may be implemented utilizing monolithic wafer integration. For example, the sensing module may be monolithically integrated with circuitry implementing the ML processor on a single substrate (e.g., a single-crystal silicon substrate). The ML processor may include one or more CMOS circuits that include transistors, RRAM devices, interconnect layers, and/or any other suitable components for implementing the ML processor. The sensing module may include photodiodes, interconnect layers, color filters, micro lenses and/or any other suitable components for implementing the sensing module.

In one implementation, the sensing module and the ML processor may be fabricated on non-overlapping portions of the substrate. For example, the sensing module may be fabricated on a central portion of the substrate. The ML processor may be fabricated on a second portion of the substrate that surrounds the central portion of the substrate. The sensing module and the ML processor may be fabricated on the same side of the substrate. In another implementation, the sensing module and the ML processor may be fabricated on different sides of the substrate. For example, the CMOS circuits implementing the ML processor may be fabricated on a first side of the substrate. The substrate may then be flipped over to expose a second side of the substrate (e.g., the reverse side of the substrate). The sensing module may be fabricated on the second side of the substrate. In still another implementation, the CMOS circuits implementing the ML processor may be fabricated on the substrate. The sensing module may then be fabricated on the CMOS circuits.

The monolithic integration of the sensing module with the ML processor may provide 3D heterogeneous integration of sensing and processing functionalities and may enable desirable hardware processing capabilities, such as near-sensing processing, in-memory computing, analog computing, and parallel computing. The monolithically integrated sensing module and ML processor may be used to implement 3D neural network hardware, resulting in higher device density, complex connectivity, and reduced communication loss. In some embodiments, the ML processor may also provide a two-dimensional interface (the cross-section of a 3D neural network) to communicate with 2D sensor arrays (e.g., image sensor arrays), which may enable sensing data generated by the 2D sensor arrays to directly go into the 3D neural network for processing without the need for signal storage or reconfiguring into one-dimensional data (e.g., vectors that may serve as input to a traditional 2D neural network).

Moreover, most of the sensing signals can be viewed as certain forms of energy (e.g., temperature, mechanical force, photons, vibration, chemicals, electromagnetic wave, etc.) and may be readily converted into electrical signals (e.g., 0.5 V) using emerging devices. These electrical signals are not only analog data to be processed but may also function as potential power sources to self-power the sensing modules and the other components of the processing device. In some embodiments, the processing device can thus be wakened up only in the presence of the sensing signals and can implement event-driven applications, resulting in further reduction of the amount of data collected and energy consumed for ML processing.

Figure 1B:
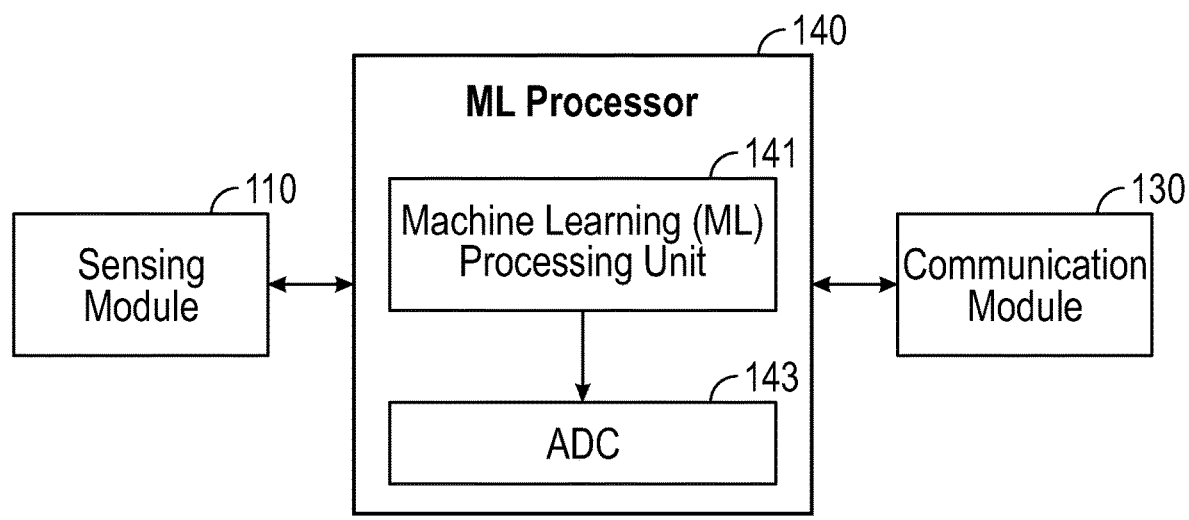

FIGS. 1A and 1B are schematic diagrams illustrating examples 100a and 100b of processing devices with integrated sensing and processing capabilities in accordance with some embodiments of the present disclosure.

As shown in FIG. 1A, processing device 100a may include a sensing module 110, a machine learning (ML) processor 120, and a communication module 130. ML processor 120 may further include a preprocessing unit 121, an analog-to-digital conversion (ADC) unit 123, and a machine learning (ML) processing unit 125. Sensing module 110, ML processor 120, and communication module 130 may be integrated into one monolithic wafer, such as a monolithic wafer described in connection with FIGS. 7A-9 below.

Sensing module 110 may include one or more sensor arrays. Each of the sensor arrays may include one or more sensors that may detect and/or measure a physical property and produce electrical signals representative of the physical property. Examples of the sensors include image sensors, audio sensors, chemical sensors, pressure sensors, heat sensors, temperature sensors, vibration sensors, microbial fuel cells, electromagnetic sensors, etc. In some embodiments, multiple sensor arrays in sensing module 110 may include varying types of sensors. In some embodiments, sensing module 110 may include one or more image sensors as described in connection with FIGS. 5A-5B below. In some embodiments, sensing module 110 may produce analog sensing data in the form of analog sensing signals (e.g., voltage signals, current signals, etc.), such as analog image signals generated by an array of image sensors (e.g., CMOS image sensors) that may detect light and produce analog image signals representative of the detected light.

In some embodiments, the sensors in sensing module 110 may harvest sufficient energy to enable ML processor 120 and/or processing device 100a to operate without requiring an external power supply. For example, the electrical signals produced by sensing module 110 may be used to power ML processor 120 and/or processing device 100a.

ML processor 120 may process the analog sensing data produced by sensing module 110 utilizing one or more machine learning models. For example, preprocessing unit 121 may process the analog sensing data and generate analog preprocessed sensing data. Preprocessing unit 121 may perform any suitable operations on the analog sensing signals to prepare the analog sensing data for the subsequent processing by ML processing unit 125. For example, preprocessing unit 121 may perform feature extraction on the analog sensing data and extract features of the analog sensing data that may be used in subsequent ML processing. As another example, preprocessing unit 121 may perform dimensionality reduction on the analog sensing data to reduce the amount of data to be processed in subsequent ML processes. As a further example, preprocessing unit 121 may perform one or more convolution operations (e.g., a two-dimensional convolution operation, a depth-wise convolution operation, etc.) on the analog sensing data. As still a further example, preprocessing unit 121 may normalize the analog sensing data, rescale and/or resize the analog sensing data, denoise the analog sensing data, etc. In some embodiments in which the analog sensing data includes analog image signals, preprocessing unit 121 may process the analog sensing data utilizing suitable image processing techniques.

Preprocessing unit 121 may include one or more crossbar arrays that may process the analog sensing signals in the analog domain. Each of the crossbar arrays may include a plurality of interconnecting electrically conductive wires (e.g., row wires, column wires, etc.) and cross-point devices fabricated at the intersections of the electrically conductive wires. The cross-point devices may include, for example, memristors, phase-change memory devices, floating gates, spintronic devices, and/or any other suitable devices with programmable resistance. In some embodiments, the crossbar arrays may include one or more crossbar arrays as described in connection with FIGS. 2-3 below.

As an example, a crossbar array may receive an input voltage signal V and may produce an output current signal I. The relationship between the input voltage signal and the output current signal may be represented as I=VG, wherein G represents the conductance values of the cross-point devices. As such, the input signal is weighted at each of the cross-point devices by its conductance according to Ohm's law. The weighted current is outputted via each bit line and may be accumulated according to Kirchhoff's current law. The conductance values of the cross-point devices may be programmed to values and/or weights representative of one or more matrices used for performing the preprocessing of the analog sensing data as described above (e.g., feature extraction, dimension reduction, convolution, image processing, etc.). The crossbar array may receive the analog sensing signals generated by the sensors in sensing module 110 as input and may produce analog output signals (e.g., current signals) representative of the preprocessed analog sensing data.

In some embodiments, sensing module 110 may include sensors arranged as a two-dimensional (2D) sensor array. As each of the sensors may produce an analog sensing signal, the output of the 2D sensor array may be regarded as a 2D output including the analog sensing signals produced by the sensors (e.g., m×n analog sensing signals produced by m×n sensors). Preprocessing unit 121 may include a three-dimensional (3D) crossbar array that includes multiple 2D crossbar arrays arranged in a 3D manner. For example, the 2D crossbar arrays may be positioned at different planes (e.g., parallel planes that are perpendicular to a substrate on which the 3D crossbar array is fabricated). The cross-section of the 3D crossbar array is 2D and may receive and/or process the 2D output produced by sensing module 110 (e.g., m×n analog sensing signals) without converting the 2D output into one-dimensional data (e.g., vectors representing the sensing signals produced by the sensors). The 3D crossbar array circuit may be and/or include the 3D crossbar array circuit as described in connection with FIG. 3 below. In some embodiments, the 3D crossbar array circuit may be fabricated utilizing the techniques described in connection with U.S. patent application Ser. No. 16/521,975, entitled "Crossbar Array Circuit with 3D Vertical RRAM," which is incorporated herein by reference in its entirety.

Analog-to-digital converter (ADC) 123 may include any suitable circuitry for converting the analog preprocessed sensing data into digital preprocessed sensing data. In some embodiments, ADC 123 may include one or more ADC 250 as described below in connection with FIG. 2.

ML processing unit 125 may include circuitry for processing the digital preprocessed sensing data using one or more machine learning models. In some embodiments, ML processing unit 125 may include a digital signal processor. ML processing unit 125 may generate a predictive output by running a trained machine learning model using the digital preprocessed sensing data. The predictive output may represent, for example, a classification result (e.g., a class label to be assigned to the sensing data), a decision made based on the machine learning models, etc. The machine learning model may refer to the model artifact that is created by a processing device using training data including known training inputs and corresponding known outputs (correct answers for respective training inputs). The processing device may find patterns in the training data that map the known inputs to the known outputs (the outputs to be predicted) and provide a machine learning model that captures these patterns.

The machine learning models may include a machine learning model composed of a single level of linear or non-linear operations (e.g., a support vector machine), a neural network that is composed of multiple levels of non-linear operations, etc. The neural network may include an input layer, one or more hidden layers, and an output layer. The neural network may be trained by, for example, adjusting weights of the neural network in accordance with a backpropagation learning algorithm or the like. In some embodiments, the crossbar arrays in preprocessing unit 121 may implement one or more layers of the neural network. For example, the analog preprocessed sensing data produced by preprocessing unit 121 may represent the output of the input layer or a hidden layer of the neural network.

Communication module 130 may include any suitable hardware and/or software for facilitating communications between processing device 100a and one or more other computing devices. For example, communication module 130 may include one or more transceivers that may transmit and/or receive RF (radio frequency) signals. Communication module 130 may include components for implementing one or more other wireless transmission protocols (e.g., Wi-Fi, BLUETOOTH, ZIGBEE, cellular, etc.). In some embodiments, communication module 130 may include one or more antennas that may be integrated into monolithic substrate 420 or packaging substrate 410 of FIG. 4. Communication module 130 may transfer the outputs of ML processor 120 to another computing device (e.g., a cloud computing device) for further processing. In some embodiments, communication module 130 may further receive, from the computing device, instructions for performing operations based on the predictive output (e.g., turning on a display based on a face recognition result, transmitting data to one or more other processing devices, presenting media content, etc.).

Referring to FIG. 1B, processing device 100b may include a sensing module 110, a machine learning (ML) processor 140, and a communication module 130. Sensing module 110 and communication module 130 may be the same as their counterparts described in connection with FIG. 1A above.

ML processor 140 may process the analog sensing data produced by sensing module 110 using one or more machine learning models. ML processor 140 may include a machine learning (ML) processing unit 141 and an ADC 143. ML processing unit 141 may process the analog sensing data produced by sensing module 110 using one or more machine learning models to generate an analog predictive output. The analog predictive output may include one or more analog signals.

In some embodiments, ML processing unit 141 may include one or more crossbar arrays, each of which may include a crossbar array as described in connection with FIG. 2 below. In some embodiments, ML processing unit 141 may include a 3D crossbar array as described in connection with FIG. 3 below. In some embodiments, the crossbar arrays may implement a neural network executing machine learning algorithms. The output signals of the crossbar arrays may represent an output of the neural network. The neural network may include multiple convolutional layers, each of which may perform certain convolution operations (e.g., 2D convolution, depth-wise convolution, etc.). Each layer of the neural network may be implemented using one or more crossbar arrays. For example, one or more first crossbar arrays may implement a first layer (e.g., an input layer) of the neural network. The first crossbar array(s) may receive the analog sensing data produced by sensing module 110 as input and perform one or more convolution operations on the analog sensing signals. Performing a convolution operation on the analog sensing data may involve convolving different portions of the sensing data using one or more kernels. For example, a 2D convolution may be performed by applying a single convolution kernel to the analog sensing data. More particularly, the convolution kernel may be used to scan each part of the sensing data with the same size as the convolution kernel to produce a convolution result. As another example, performing a depth-wise convolution on the sensing data may involve convolving each channel of the sensing data with a respective kernel and stacking the convolved outputs together. For example, the conductance values of a plurality of cross-point devices of the first crossbar array(s) may be programmed to values representative of a 2D convolution kernel. The analog sensing signals may be provided to the first crossbar array(s) as input signals. The first crossbar array(s) may output a current signal representative of a convolution of the analog sensing signals and the 2D convolution kernel. In some embodiments, the crossbar array(s) may store multiple 2D convolution kernels by mapping each of the 2D convolution kernels to a plurality of cross-point devices of the first crossbar array(s). The first crossbar array(s) may output a plurality of output signals (e.g., current signals) representative of the convolution results. The outputs of the first crossbar array(s) may be provided to one or more second crossbar arrays implementing a second layer of the neural network for processing. The outputs of the second crossbar arrays (e.g., analog current signals) may represent the outputs of the second layer of the neural network. The outputs of the second crossbar arrays may be provided to one or more crossbar arrays implementing a subsequent layer of the neural network (e.g., a second hidden layer) for processing. One or more third crossbar arrays may implement an output layer of the neural network. The outputs of the third crossbar arrays (e.g., analog current signals) may represent the output of the neural network. In some embodiments, the neural network may be implemented using crossbar arrays as disclosed in U.S. patent application Ser. No. 16/125,454, entitled "Implementing a Multi-Layer Neural Network Using Crossbar Array," which is incorporated herein by reference in its entirety.

ADC 143 may include any suitable circuitry for converting the analog outputs of ML processing unit 141 into a digital output. The digital output may represent the predictive output. In some embodiments, ADC 143 may include ADC 250 of FIG. 2.

Communication module 130 may transfer the outputs of ML processor 140 to another computing device (e.g., a cloud computing device) for further processing. In some embodiments, communication module 130 may further receive, from the computing device, instructions for performing operations based on the predictive output (e.g., turning on a display based on a face recognition result, transmitting data to another processing device, presenting media content, etc.).

In some embodiments, processing device 100a-b may be self-powered and may operate without an external power source. For example, sensing module 110 may provide power to the components of processing device 100a-b. ML processors 120 and 140 and their components may be powered utilizing the analog outputs produced by sensing module 110 to operate as described herein.

Figure 2:
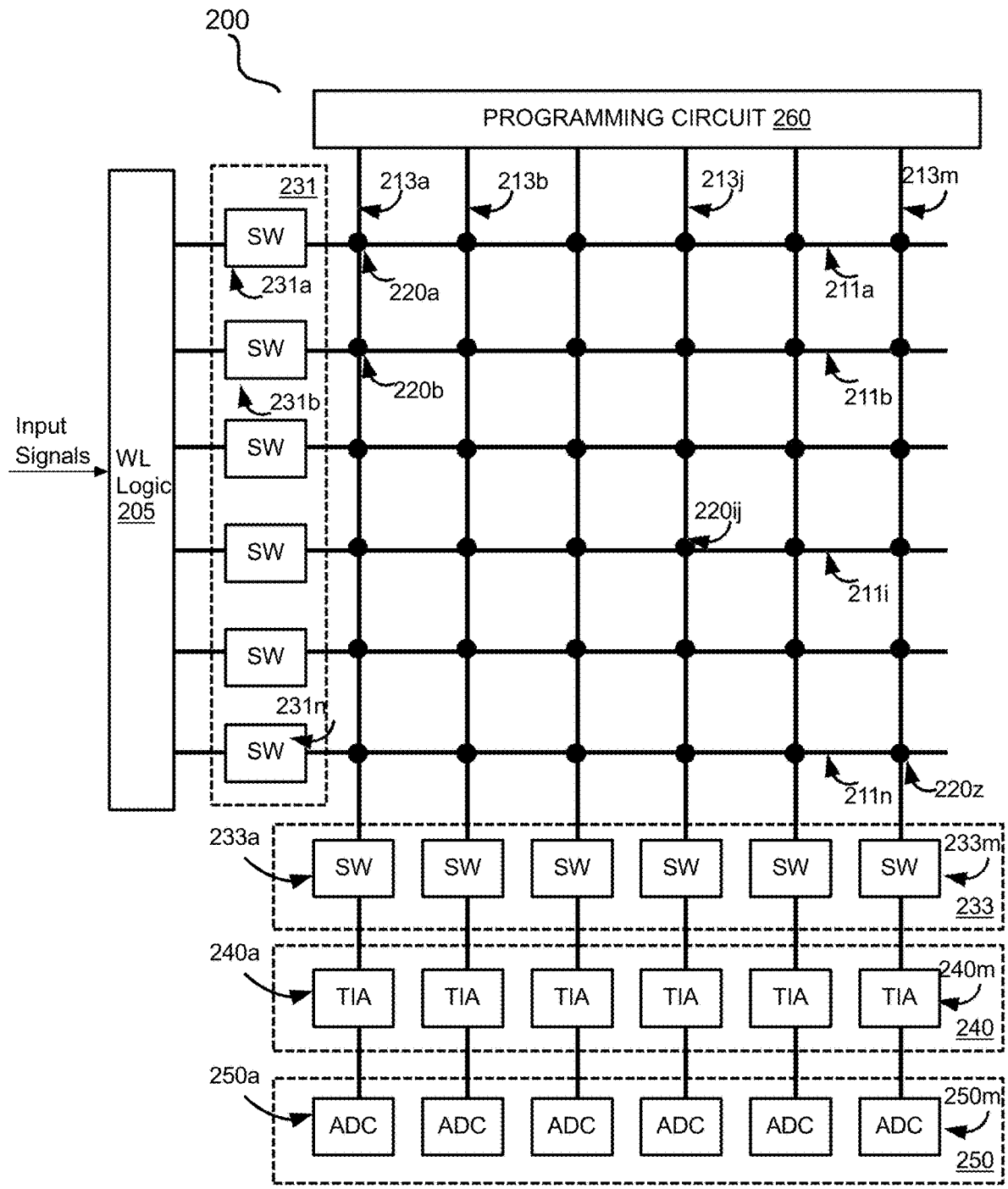
FIG. 2 is a diagram illustrating an example of a crossbar array in accordance with some embodiments of the present disclosure.

FIG. 2 is a diagram illustrating an example 200 of a crossbar array in accordance with some embodiments of the present disclosure. As shown, crossbar array 200 may include a plurality of interconnecting electrically conductive wires, such as one or more row wires 211a, 211b, . . . , 211i, . . . , 211n, and column wires 213a, 213b, . . . , 213j, . . . , 213m for an n-row by m-column crossbar array. The crossbar array 200 may further include cross-point devices 220a, 220b, . . . , 220z, etc. Each of the cross-point devices may connect a row wire and a column wire. For example, the cross-point device 220ij may connect the row wire 211i and the column wire 213j. The number of the column wires 213a-m and the number of the row wires 211a-n may or may not be the same. Crossbar array 200 may further include a word line (WL) logic 205 that is connected to the cross-point devices via the row wires 211. The WL logic 205 may include any suitable component for applying input signals to selected cross-point devices via row wires 211, such as one or more digital-to-analog converters (DACs), amplifiers, etc. Each of the input signals may be a voltage signal, a current signal, etc. The input signals may correspond to the analog sensing signals produced by sensing module 110 of FIGS. 1A-1B.

Row wires 211 may include a first row wire 211a, a second row wire 211b, . . . , 211i, . . . , and a n-th row wire 211n. Each of row wires 211a, . . . , 211n may be and/or include any suitable electrically conductive material. In some embodiments, each row wire 211a-n may be a metal wire.

Column wires 213 may include a first column wire 213a, a second column wire 213b, . . . , and an m-th column wire 213m. Each of column wires 213a-m may be and/or include any suitable electrically conductive material. In some embodiments, each column wire 213a-m may be a metal wire.

Each cross-point device 220 may be and/or include any suitable device with tunable resistance, such as a memristor, phase-change memory (PCM) devices, floating gates, spintronic devices, ferroelectric devices, RRAM devices, etc.

Each of row wires 211a-n may be connected to one or more row switches 231 (e.g., row switches 231a-n). Each row switches 231 may include any suitable circuit structure that may control current flowing through row wires 211a-n. For example, row switches 231 may be and/or include a CMOS switch circuit.

Each of column wires 213a-m may be connected to one or more column switches 233 (e.g., switches 233a-m). Each column switches 233a-m may include any suitable circuit structure that may control current passed through column wires 213a-m. For example, column switches 233a-m may be and/or include a CMOS switch circuit. In some embodiments, one or more of switches 231a-n and 233a-m may further provide fault protection, electrostatic discharge (ESD) protection, noise reduction, and/or any other suitable function for one or more portions of crossbar array 200.

Output sensor(s) 240 may include any suitable component for converting the current flowing through column wires 213a-n into the output signal, such as one or more TIAs (trans-impedance amplifier) 240a-n. Each TIAs 240a-n may convert the current through a respective column wire into a respective voltage signal. Each ADCs 250a-n may convert the voltage signal produced by its corresponding TIA into a digital output. In some embodiments, output sensor(s) 240 may further include one or more multiplexers (not shown).

The programming circuit 260 may program the cross-point devices 220 selected by switches 231 and/or 233 to suitable conductance values. For example, programming a cross-point device may involve applying a suitable voltage signal or current signal across the cross-point device. The resistance of each cross-point device may be electrically switched between a high-resistance state and a low-resistance state. Setting a cross-point device may involve switching the resistance of the cross-point from the high-resistance state to the low-resistance state. Resetting the cross-point device may involve switching the resistance of the cross-point from the low-resistance state to the high-resistance state.

Crossbar array 200 may perform parallel weighted voltage multiplication and current summation. For example, an input voltage signal may be applied to one or more rows of crossbar array 200 (e.g., one or more selected rows). The input signal may flow through the cross-point devices of the rows of the crossbar array 200. The conductance of the cross-point device may be tuned to a specific value (also referred to as a "weight"). By Ohm's law, the input voltage multiplies the cross-point conductance and generates a current from the cross-point device. By Kirchhoff's law, the summation of the current passing the devices on each column generates the current as the output signal, which may be read from the columns (e.g., outputs of the ADCs). According to Ohm's law and Kirchhoff's current law, the input-output relationship of the crossbar array can be represented as I=VG, wherein I represents the output signal matrix as current; V represents the input signal matrix as voltage; and G represents the conductance matrix of the cross-point devices. As such, the input signal is weighted at each of the cross-point devices by its conductance according to Ohm's law. The weighted current is outputted via each column wire and may be accumulated according to Kirchhoff's current law. This may enable in-memory computing (IMC) via parallel multiplications and summations performed in the crossbar arrays.

Crossbar array 200 may be configured to perform vector-matrix multiplication (VMM). A VMM operation may be represented as Y=XA, wherein each of Y, X, A represents a respective matrix. More particularly, for example, input vector X may be mapped to the input voltage V of crossbar array 200. Matrix A may be mapped to conductance values G. The output current I may be read and mapped back to output results Y. In some embodiments, crossbar array 200 may be configured to implement a portion of a neural network by performing VMMs.

In some embodiments, crossbar array 200 may perform convolution operations. For example, performing 2D convolution on input data may involve applying a single convolution kernel to the input signals. Performing a depth-wise convolution on the input data may involve convolving each channel of the input data with a respective kernel corresponding to the channel and stacking the convolved outputs together. The convolution kernel may have a particular size defined by multiple dimensions (e.g., a width, a height, a channel, etc.). The convolution kernel may be applied to a portion of the input data having the same size to produce an output. The output may be mapped to an element of the convolution result that is located at a position corresponding to the position of the portion of the input data.

The programming circuit 260 may program the crossbar array 200 to store convolution kernels for performing 2D convolution operations. For example, a convolution kernel may be converted into a vector and mapped to a plurality of cross-point devices of the crossbar array that are connected to a given bit line. In particular, the conductance values of the cross-point devices may be programmed to values representative of the convolution kernel. In response to the input signals, the crossbar array 200 may output, via the given bit line, a current signal representative of a convolution of the input signals and the 2D convolution kernel. In some embodiments, crossbar array 200 may store multiple 2D convolution kernels by mapping each of the 2D convolution kernels to the cross-point devices connected to a respective bit line. Crossbar array 200 may output a plurality of output signals (e.g., current signals) representative of the convolution results via column wires 213.

Figure 3:
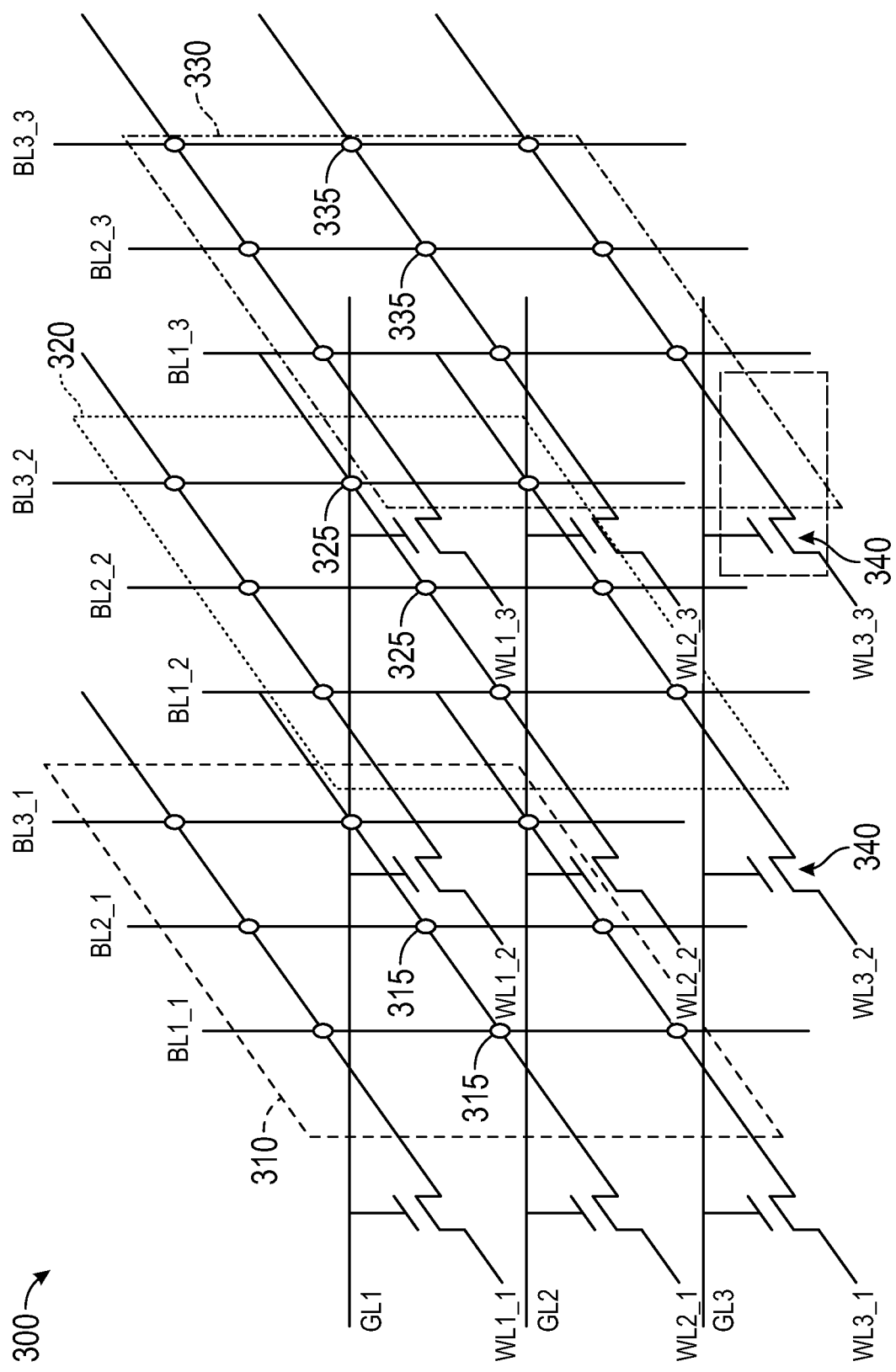
FIG. 3 is a schematic diagram illustrating an example three-dimensional crossbar array in accordance with some embodiments of the present disclosure.

FIG. 3 is a schematic diagram illustrating an example 3D crossbar array circuit 300 in accordance with some embodiments of the present disclosure.

As shown, 3D crossbar array circuit 300 may include a first crossbar array 310, a second crossbar array 320, and a third crossbar array 330 that are positioned at different planes. In some embodiments, first crossbar array 310, second crossbar array 320, and third crossbar array 330 may be positioned at a first plane, a second plane, and a third plane, respectively. The first plane, the second plane, and the third plane may be parallel to each other. In some embodiments, the first plane, the second plane, and the third plane may be perpendicular or parallel to a substrate on which first crossbar array 310, second crossbar array 320, and third crossbar array 330 that are formed. Each of first crossbar array 310, second crossbar array 320, and third crossbar array 330 may include one or more 2D crossbar arrays as described in connection with FIG. 2. While three crossbar arrays are illustrated in FIG. 3, 3D crossbar array circuit 300 may include any suitable number of 2D crossbar arrays integrated into a 3D crossbar circuit.

First crossbar array 310 may include cross-point devices 315 connecting a first plurality of word lines (WL1_1, WL2_1, WL3_1, etc.) and a first plurality of bit lines (BL1_1, BL2_1, BL3_1, etc.). Second crossbar array 320 may include cross-point devices 325 connecting a second plurality of word lines (WL1_2, WL2_2, WL3_2, etc.) and a second plurality of bit lines (BL1_2, BL2_2, BL3_2, etc.). Third crossbar array 330 may include cross-point devices 335 connecting a third plurality of word lines (WL1_3, WL2_3, WL3_3, etc.) and a third plurality of bit lines (BL1_3, BL2_3, BL3_3, etc.).

3D crossbar array circuit 300 may further include transistors 340. Each transistor 340 may be connected to a respective gate line (GL1, GL2, GL3, etc.) via its gate region. For example, gate line GL1 may be connected to the gate region of a first transistor in first crossbar array 310, the gate region of a second transistor in a second crossbar array 320, and the gate region of a third transistor in a third crossbar array 330. The source region of a respective transistor 340 may be connected to a word line. It is to be noted that FIG. 3 schematically shows components of 3D crossbar array circuit 300 and their connections. The schematic diagram shown in FIG. 3 does not represent the physical layout of the components of 3D crossbar array circuit 300. The components of 3D crossbar array circuit 300 may be physically arranged and positioned in any suitable manner to implement a 3D crossbar array as described herein. For example, in a physical layout of 3D crossbar array circuit 300, the transistors 340 may be placed in the same layer in a substrate and may then be connected through vertical vias to the corresponding gate lines, bit lines, and word lines.

To select a cross-point device located at the cross point of WL3_3 and BL3_3, a voltage $V_G$ may be applied to GL3 while the other GLs may be grounded, causing the transistor channels on GL3 to open. A voltage V D may be applied to the drain regions of the transistors connected to WL3_3, while the drain regions of the other transistors located on the same horizontal layer are grounded, causing current to be able to pass through only WL3_3. A voltage $V_{ground}$ may be applied to BL3_3 while Vs may be maintained on the other BLs intersecting with WL3_3. Vs may be equal to Vd-Vds, where Vs represent the voltage at a transistor's source region, and Vds represent a voltage drop across the transistor's drain region and source region. Accordingly, only one device on a WL is programmed by the voltage difference between Vs and $V_{ground}$. The other devices on the same WL (WL3_3) are not programmed due to the lack of voltage difference on those devices.

As the crossbar arrays are arranged in a 3D manner in 3D crossbar array circuit 300, the cross-section of 3D crossbar array circuit 300 may be regarded as being a 2D crossbar array. 3D crossbar array circuit 300 may thus receive and process a 2D input (e.g., m×n analog input signals) without storing the 2D input or converting the 2D input into one-dimensional data (e.g., vectors representing the 2D input). For example, cross-point devices located on WL1_1, WL1_2, WL1_3, etc. may be selected as described above to receive and process analog sensing signals produced by a 2D sensor array.

FIGS. 4A and 4B are schematic diagrams illustrating example semiconductor devices 400a and 400b that can function as a machine learning processor in accordance with some embodiments of the present disclosure.

As shown in FIG. 4A, semiconductor device 400a may include a monolithic wafer 420 and a packaging substrate 410. Packaging substrate 410 may include antennas, connectors, power supply, etc. In some embodiments, packaging substrate 410 does not include a CMOS component. Monolithic wafer 420 may be connected to packaging substrate 410 through an interconnect layer 430. For example, interconnect layer 430 may include ball grid array (BGA) bumps. In some embodiments, packaging substrate 410 may be connected to a PCB (printed circuit board) substrate (not shown).

Monolithic wafer 420 may include a sensing module including one or more sensor arrays (e.g., sensing module 110 as described in connection with FIGS. 1A-1B). In some embodiments, monolithic wafer 420 may include one or more image sensor wafers as described in connection with FIGS. 5A-5B below.

Monolithic wafer 420 may further include ADC, crossbar arrays, driver IC (integrated circuit), CMOS elements for implementing a transceiver, and/or any other suitable component for implementing machine learning processing. In some embodiments, monolithic wafer 420 may include one or more CMOS circuits implementing ML processor 120 of FIG. 1A and/or ML processor 140 of FIG. 1B (e.g., CMOS circuits 600a-b as described in connection with FIGS. 6A-6B). Monolithic wafer 420 may include a monolithic wafer as described in connection with FIGS. 7A-9 below.

Referring to FIG. 4B, multiple monolithic wafers may be stacked on packaging substrate 410 in some embodiments. As shown, monolithic wafters 420a, 420b, and 420c may be connected to packaging substrate 410 via interconnect layers 430a, 430b, and 430c, respectively. In some embodiments, monolithic wafters 410a, 410b, and 410c may include various types of sensors and may sense different signals and may process different sensing signals produced by the sensors. Each of monolithic wafters 420a-c and interconnect layers 430a-c may be and/or include its counterpart as described in connection with FIG. 4A (i.e., monolithic wafer 420 and interconnect layer 430). While a certain number of wafers are shown in FIGS. 4A and 4B, this is merely illustrative. Any suitable number of monolithic wafters may be stacked on packaging substrate 410 as described herein.

Figure 5A:
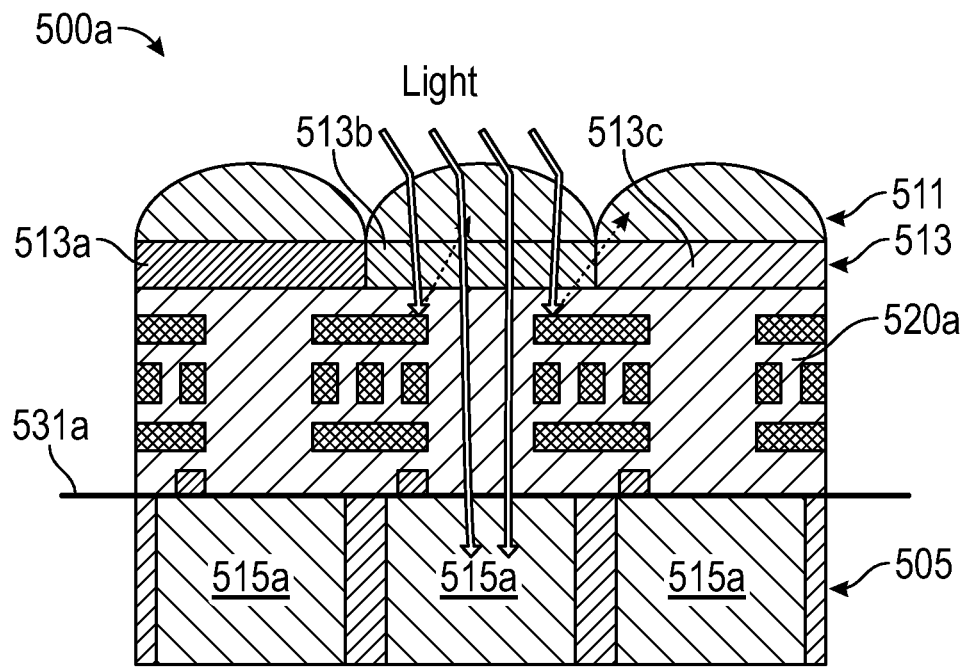
FIGS. 5A and 5B are diagrams illustrating cross-sectional views of example image sensor wafers in accordance with some embodiments of the present disclosure.
Figure 5B:
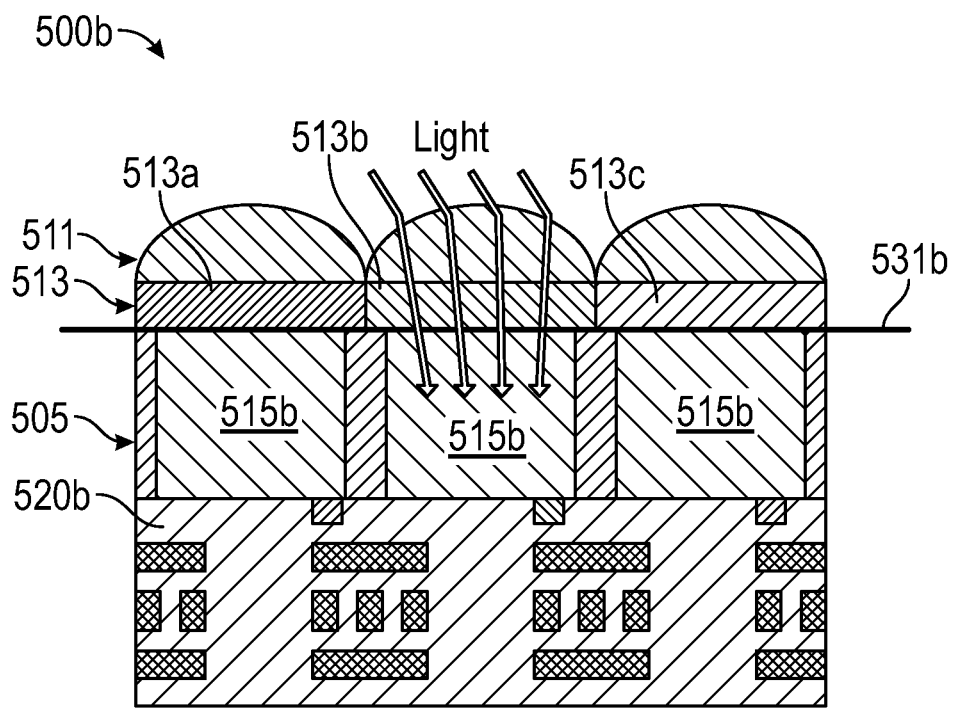

FIGS. 5A and 5B are diagrams illustrating cross-sectional views of example image sensor wafers 500a and 500b in accordance with some embodiments of the present disclosure. Each of image sensor wafers 500a and 500b may also be referred to as a CMOS image sensor (CIS) wafer.

As shown in FIG. 5A, image sensor wafer 500a may include an image sensor including micro lenses 511, color filters 513, and photodiodes 515a. Photodiodes 515a may be fabricated on a substrate 505 (e.g., a silicon substrate). Substrate 505 may be and/or include the substrate 710 of FIGS. 7A-7F and/or the substrate 810 of FIGS. 8A-9. Metal wiring 520a may be located between color filters 513 and photodiodes 515a.

Incident light may be focused through micro lenses 511 and may be separated into multiple color components by one or more sets of color filters 513. For example, a red color filer 513a, a green color filter 513b, and a blue color filter 513c, may separate a red component, a green component, and a blue component of the incident light, respectively. Photodiodes 515a may accumulate photonic charge when exposed to light and may convert the charges to electrical signals (voltage signals).

Referring to FIG. 5B, image sensor wafer 500b includes a back-illuminated structure in which photodiodes 515b are arranged behind color filters 513 and metal wiring 520b is arranged behind photodiodes 515b. Image sensor wafer 500b may be fabricated by fabricating the photodiodes 515b and metal wiring 520b on a front-side silicon substrate 505, then flipping the substrate 505, thinning the reverse-side substrate, and fabricating the color filters 513 and micro lens 511 on the reverse side. As shown, metal wirings 520b are positioned behind the photodiodes 515b while metal wirings 520a are positioned in front of photodiodes 515a. The light may be incident on interface 531a in image sensor wafer 500a and interface 531b in image sensor wafer 500b, respectively. As such, photodiodes 515b may capture more light signals than the photodiodes 515a since the light can reach photodiodes 511b without passing through metal wirings 520b.

Figure 6A:
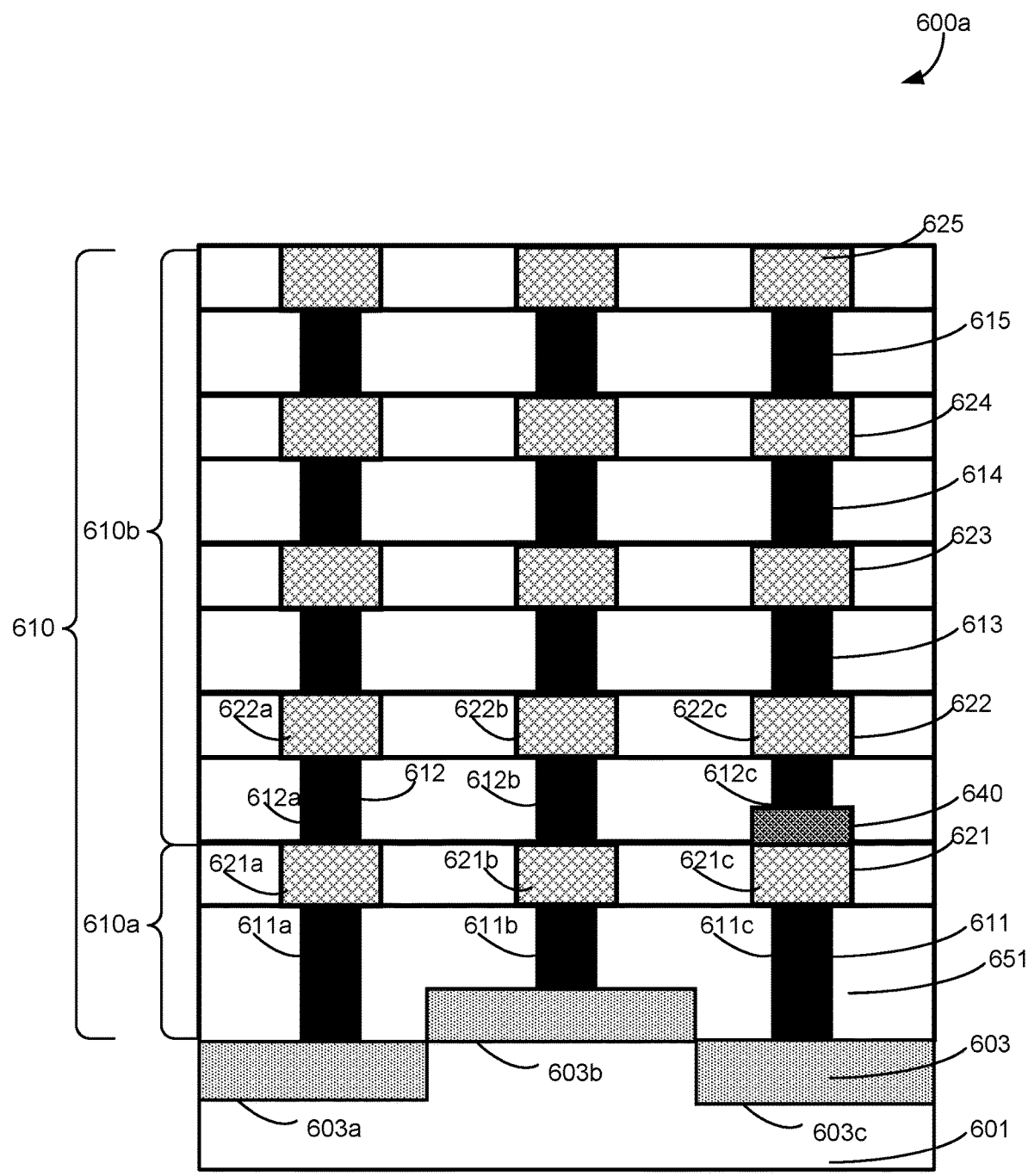
FIGS. 6A and 6B are schematic diagrams illustrating cross-sectional views of example CMOS circuits and including CMOS-compatible RRAMs in accordance with some embodiments of the present disclosure.
Figure 6B:
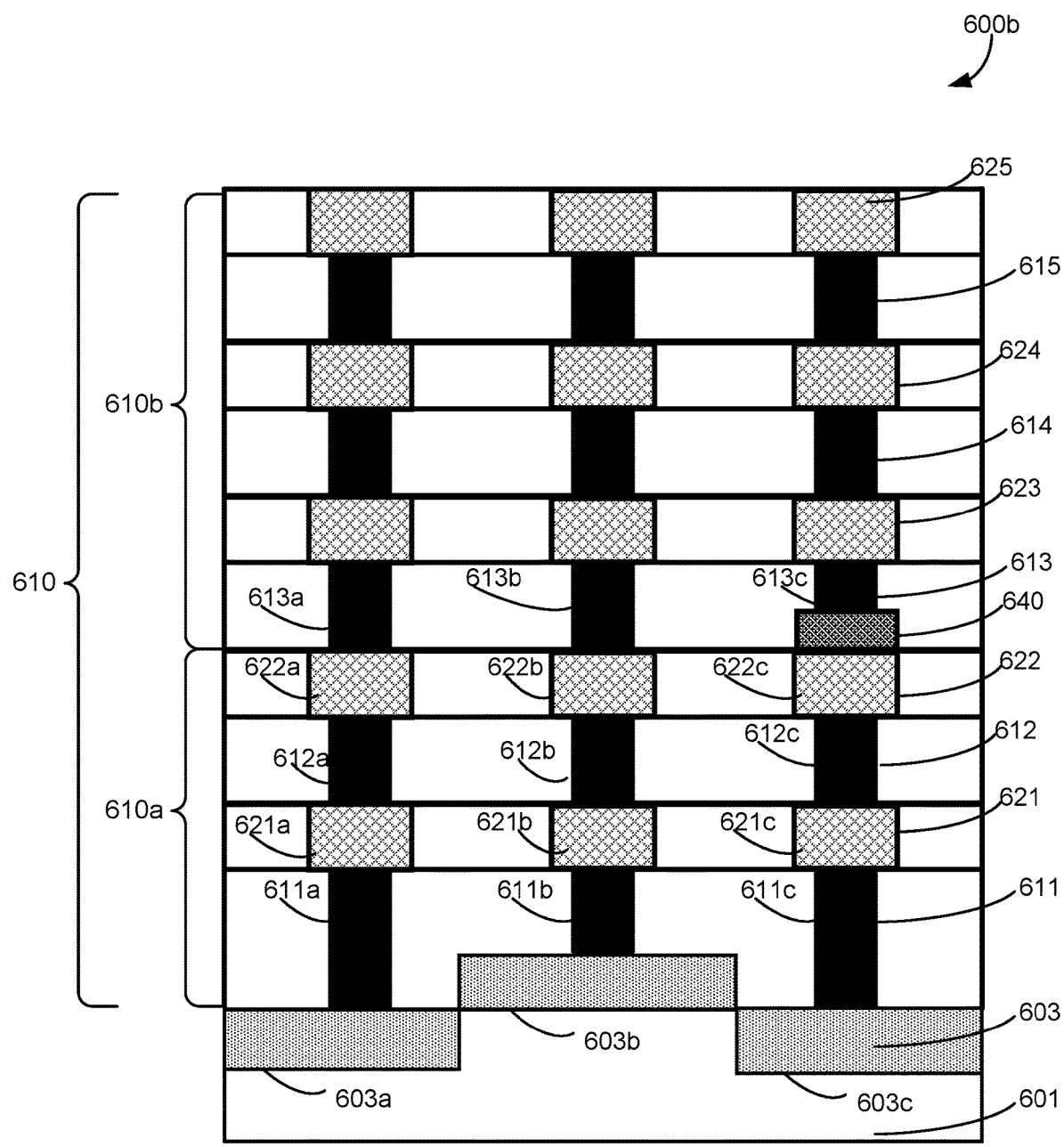

FIGS. 6A and 6B are schematic diagrams illustrating cross-sectional views of example CMOS circuits 600a and 600b including CMOS-compatible RRAMs in accordance with some embodiments of the present disclosure.

As shown, a transistor 603 is fabricated on a substrate 601. The transistor 603 may include a source region 603a, a gate 603b, and a drain region 603c. While one transistor is shown in FIG. 6A, this is merely illustrative. Multiple transistors (not shown) may be fabricated on the substrate 601 in some embodiments. The transistors may be isolated by suitable insulator and/or dielectric materials. The substrate 601 may include any suitable material that may serve as a substrate for fabricating CMOS circuits, such as silicon (Si), silicon dioxide ($SiO_2$), silicon nitride ($Si_3N_4$), aluminum oxide ($Al_2O_3$), aluminum nitride (AlN), etc.

The CMOS circuit 600a may include interconnect layers 610 fabricated on the transistor 603 and the substrate 601. Each of the interconnect layers 610 may provide electrical connectivity between the transistor 603 and/or one or more other devices (e.g., one or more other transistors, one or more other RRAM devices, etc.). The interconnect layers 610 may include, for example, via layers 611, 612, 613, 614, . . . , and 615 and metal layers 621, 622, 623, 624, . . . , and 625. Although via layers up to 615 and pad layers up to 625 are shown in FIGS. 6A-6B for illustration simplification, additional via layers and pad layers may be fabricated for integration and/or interconnection needs. Each of the via layers may include one or more metallic vias. Each of the metallic vias may include a suitable metallic material, such as Al, Cu, W, etc. Each of the metal layers may include one or more metallic pads. Each of the metallic pads may include a suitable metallic material, such as Al, Cu, W, etc. For example, the via layer 611 may include metallic vias 611a, 611b, and 611c that may be connected to the source region 603a, the gate 603b, and the drain region 603c of the transistor 603, respectively. In some embodiments, the via layer 611 may include tungsten (W) vias and doped polycrystalline Si (poly-Si) terminals where poly-Si terminals may directly contact the gate 603b, the source region 603a, and the drain region 603c of the transistor 603. The tungsten vias may directly contact the poli-Si terminals. The other via layers and metals layers above the via layer 611 may be fabricated with Cu, W, Al, etc. The metal layer 621 may include metallic pads 621a, 621b, and 621c. The metallic pads 621a, 621b, and 621c may be connected to the metallic vias 611a, 611b, and 611c, respectively.

Each of the interconnect layers may be fabricated by fabricating a dielectric layer, patterning the dielectric layer, and depositing suitable metals in the patterned dielectric layer. The dielectric layer may include any suitable dielectric material, such as silicon nitride ($Si_3N_4$), silicon dioxide ($SiO_2$), etc. For example, to fabricate the first via layer 611, a dielectric layer 651 may be fabricated on the substrate 601 and the transistor 603. The dielectric layer 651 may be processed utilizing any suitable deposition techniques. For example, the dielectric layer 651 may be patterned and filled by metal deposition to fabricate the metallic vias 611a, 611b, and 611c in the dielectric layer 651. In some embodiments, one or more interconnect layers 610 may be fabricated utilizing a dual-damascene fabrication process in which the metallic vias of a via layer and the metallic pads of a metal layer can be deposited and patterned in the same metallization process.

As shown, a pair of neighboring metal layers may be connected through a via layer fabricated between the neighboring metal layers. For example, a first metal layer 621 may be connected to a second metal layer 622 through a via layer 612. In particular, the metallic pad 622a of the metal layer 622 may be connected to the metallic pad 621a of the metal layer 621 through the metallic via 612a. The metallic pad 622b of the metal layer 622 may be connected to the metallic pad 621b of the metal layer 621 through the metallic via 612b. As shown in FIG. 6B, the metallic pad 622c of the metal layer 622 may be connected to the metallic pad 621c of the metal layer 621 through the metallic via 612c.

The interconnect layers 610 may have varying dimensions. The sizes of the metallic pads of the metal layers 621, 622, 623, 624, . . . , and 625 may increase sequentially. Similarly, the sizes of the metallic via in the via layers 611, 612, 613, 614, . . . , and 615 may increase sequentially. For example, the CMOS circuit 600a-b may be part of a 65 nm technology node. The width and the spacing of the metallic pads of the metal layer 621 may be about 90 nm. The width and the spacing of the metallic pads of the metal layers 622 and 623 may be about 100 nm. The width and the spacing of the metallic pads of the metal layers 625 may be about 400 nm.

An RRAM device 640 may be fabricated during the fabrication of the interconnect layers 610. As such, the RRAM device 640 is referred to as a CMOS-compatible RRAM device. For example, one or more first interconnect layers 610a may be fabricated on the transistor 603 and/or the substrate 601. The RRAM device 640 may be fabricated on a metallic pad or a metallic via of the top interconnect layer of the first interconnect layers 610a. One or more second interconnect layers 610b may then be fabricated on the RRAM device 640 and the first interconnect layers 610a. More particularly, for example, a metallic pad or metallic via of the bottom interconnect layer of the second interconnect layers 610b may be fabricated on the RRAM device 640 and may directly contact the RRAM device 640. In some embodiments, as shown in FIG. 6A, the first interconnect layers 610a may include the via layer 611 and the metal layer 621. The metal layer 621 may be regarded as being the top interconnect layer of the first interconnect layers 610a. The RRAM device 640 may be fabricated on the metallic pad 621c of the metal layer 621. The RRAM device 640 is connected to the drain region 603c of the transistor 603 through the metallic pad 621c of the metal layer 621 and the metallic via 611c of the via layer 611. The metallic via 612c of the via layer 612 may be fabricated on the RRAM device 640 and may be connected to a bitline of a circuit including the RRAM device 640 (e.g., the column lines 213 of FIG. 2). The metallic vias 612a and 612b of the via layer 612 may be fabricated on the metallic pads 621a and 621b, respectively. The metal layer 612 may be regarded as being the bottom interconnect layer of the second interconnect layers 610b. The second interconnect layers 610b may include one or more metal layers and/or via layers fabricated on the metal layer 612 (e.g., metal layers 622, 623, 624, and 625 and via layers 613, 614, and 615).

In some embodiments, as shown in FIG. 6B, the RRAM device 640 may be fabricated on the metallic pad 622c of the metal layer 622. The via layer 613 may be fabricated on the RRAM device 640. In particular, the metallic via 613c of the via layer 613 is fabricated on the RRAM device 640 and directly contacts the RRAM device 640. In such embodiments, the first interconnect layers 610a may include the via layer 611, the metal layer 621, the via layer 612, and the metal layer 622. The metal layer 622 may be regarded as being the top interconnect layer of the first interconnect layers 610a. The second interconnect layers 610b may include the via layers 613, 614, and 615 and the metal layers 623, 624, and 625. The via layer 613 may be regarded as the bottom interconnect layer of the second interconnect layers 610b.

Although the total processing steps involved in fabricating the interconnect layers 610 in FIGS. 6A and 6B may be the same, fabricating the first interconnect layers 610a in FIG. 6B includes more steps than fabricating the first interconnect layers 610a in FIG. 6A, while fabricating the second interconnect layers 601b in FIG. 6B includes fewer steps than fabricating the second interconnect layers 610b in FIG. 6A. The RRAM device 640 is connected to the drain region 603c of the transistor 603 through the metallic pad 622c of the metal layer 622, the metallic via 612c of the via layer 612, the metallic pad 621c of the metal layer 621, and the metallic via 611c of the via layer 611. Metallic via 613c of the via layer 613 may be fabricated on the RRAM device 640 and may be connected to the bitline of the circuit (e.g., the column lines 213 of FIG. 2). Metallic vias 613a and 613b of the via layer 613 may be fabricated on the metallic pads 622a and 622b, respectively.

While certain interconnect layers (e.g., metal layers and via layers) are shown in FIGS. 6A-6B, this is merely illustrative. The CMOS circuit 600a-b may include any suitable number of interconnect layers for implementing various integrated circuits. The first interconnect layers 610a and the second interconnect layers 610b may include any suitable number of interconnect layers. For example, the RRAM device 640 may be fabricated on the metal layer 623 or other metal layer in some embodiments. In some embodiments, RRAM device 640 may be connected to the source region 603a of the transistor 603. In such embodiments, RRAM device 640 may be fabricated on a metallic pad and/or a metallic via connected to the source region 603a.

Figure 7A:
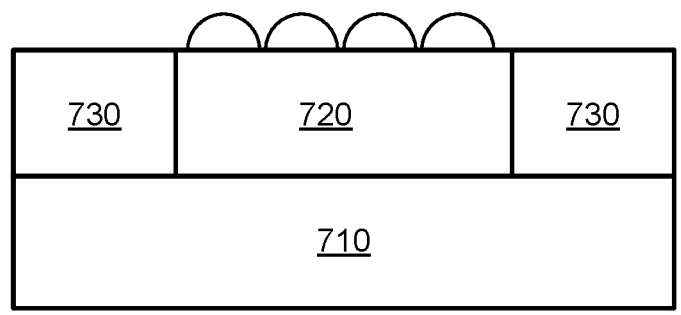
FIGS. 7A and 7B are schematic diagrams illustrating a cross-sectional view and a top view of a monolithic wafer with integrated sensing and ML processing capabilities in accordance with some implementations of the present disclosure, respectively.
Figure 7B:
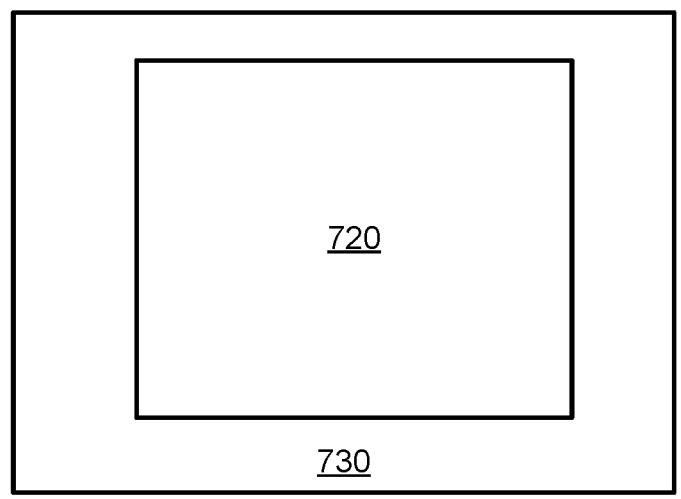

FIGS. 7A and 7B are schematic diagrams illustrating a cross-sectional view 700a and a top view 700b of a monolithic wafer with integrated sensing and ML processing capabilities in accordance with some implementations of the present disclosure, respectively. The monolithic wafer may be and/or include a monolithic wafer as described in conjunction with FIGS. 4A-4B above.

Referring to FIG. 7A, the monolithic wafer may include sensing module 720 and ML processor 730 that are fabricated on a substrate 710. Substrate 710 may be and/or include any suitable material suitable for fabricating components of a sensing module and an ML processor as described herein. For example, substrate 710 may include a silicon substrate or any other suitable substrate for fabricating CMOS circuits and the sensing module as described herein. Sensing module 720 and ML processor 730 may be fabricated on the same side of substrate 710 and on two non-overlapping portions of substrate 710. For example, as shown in FIG. 7B, sensing module 720 may be fabricated on a first portion (e.g., a central portion) of substrate 710. ML processor 730 may be fabricated on a second portion of substrate 710 that surrounds the first portion. This arrangement of sensing module 720 and ML processor 730 may reduce the routing distance between sensing module 720 and ML processor 730. It is to be noted that sensing module 720 and ML processor 730 may be arranged side by side on substrate 710 in any other suitable manner.

Sensing module 720 may include multiple sensors (e.g., sensor arrays), interconnect layers (e.g., metal wiring), and/or any other suitable component for implementing sensing module 110 of FIGS. 1A-1B. For example, sensing module 720 may include a plurality of photodiodes, color filters, and micro lenses for implementing arrays of image sensors. In some embodiments, sensing module 720 may include CIS wafers 500a and/or 500b as described in connection with FIGS. 5A-5B. ML processor 730 may include transistors, RRAM devices, interconnect layers, and/or any other suitable components for implementing ML processor 120 and/or 140 of FIGS. 1A-1B. In some embodiments, ML processor 730 may include one or more crossbar arrays for implementing various functional components of ML processor 120 and/or 140 (e.g., the crossbar arrays as described in connection with FIGS. 2-3). Each of the crossbar arrays may include one or more CMOS circuits 600a-b as described in connection with FIGS. 6A-6B.

FIGS. 7C-7I are schematic diagrams illustrating cross-sectional views of structures 700c, 700d, 700e, 700f, 700g, 700h, and 700i for fabricating the monolithic wafer as described in conjunction with FIGS. 7A-7B.

Figure 7C:
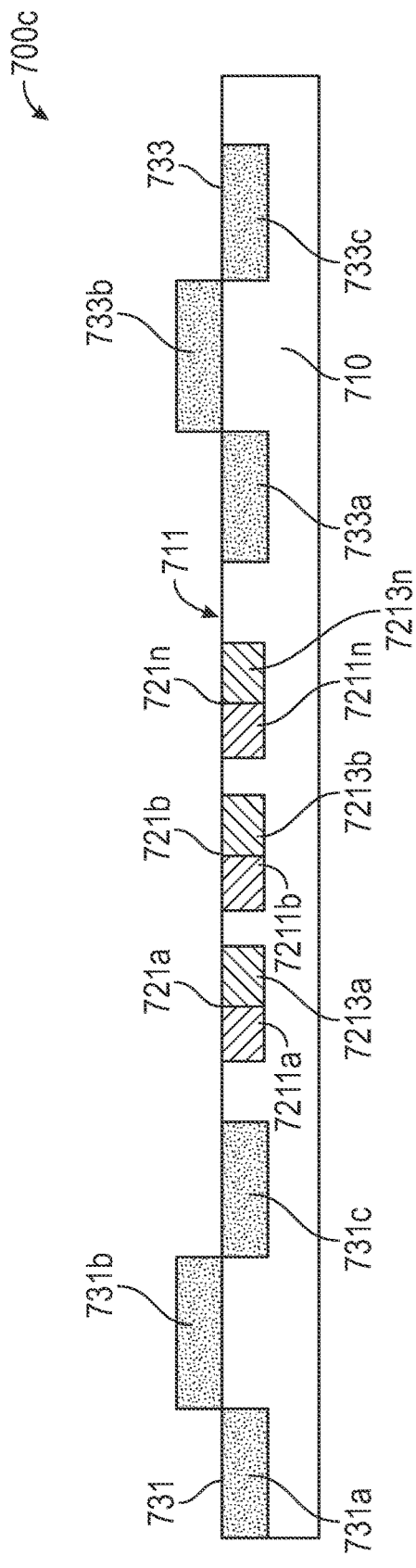
FIGS. 7C-7I are schematic diagrams illustrating cross-sectional views of structures for fabricating the monolithic wafer as described in conjunction with FIGS. 7A-7B.

As shown in FIG. 7C, transistors 731 and 733 of ML processor 730 and photodiodes 721a, 721b, . . . , 721n may be fabricated on substrate 710 (e.g., on a surface 711 of substrate 710). Each photodiode 721a-721n may be a two-terminal device containing a p-n junction that may convert photons into electrical current. For example, each photodiode 721a-721b may include a p-doped region and an n-doped region (e.g., a p-doped region 7211a and an n-doped region 7213a of photodiode 721a, a p-doped region 7211b and an n-doped region 7213b of photodiode 721b, a p-doped region 7211n and an n-doped region 7213n of photodiode 721n, etc.). In some embodiments, one or more photodiodes 721a-721n may be a p-i-n structure, where i represents an undoped intrinsic region (not shown) between the p-doped region and the n-doped region. When a bias is applied to a photodiode, the current output can be controlled to provide thresholding, linear response, or nonlinear response. In particular, photodiodes 721a-721n may be placed in reverse bias or small forward bias to cause the output current to be a linear function of input light intensity. Transistor 731 may include a source region 731a, a gate region 731b, and a drain region 731c. Transistor 733 may include a source region 733a, a gate region 733b, and a drain region 733c. While a certain number of transistors and photodiodes are shown in FIG. 7C, this is merely illustrative. ML processor 730 may include any suitable number of transistors that are fabricated on substrate 710. Sensing module 720 may include any suitable number of photodiodes that are fabricated on substrate 710. The transistors may be fabricated on a portion of substrate 710 that surrounds the photodiodes.

Figure 7D:
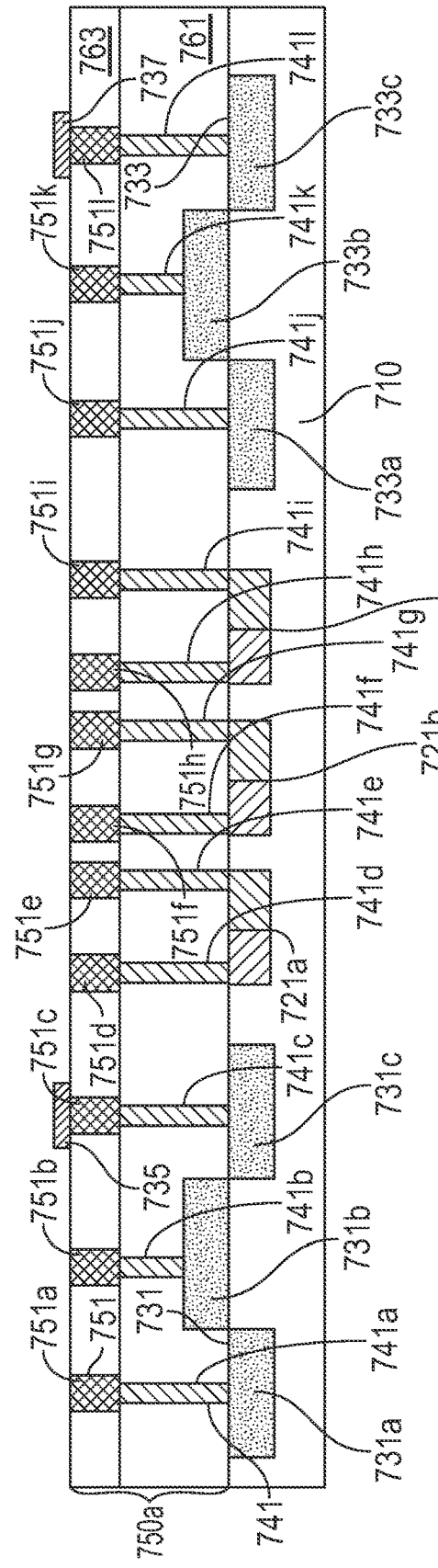

As shown in FIG. 7D, one or more interconnect layers 750a (also referred to as the "first interconnect layers") may be fabricated on the transistors of ML processor 730 and the photodiodes of the sensing module 720. First interconnect layers 750a may be and/or include metal layers and/or via layers as described in connection with FIGS. 6A-6B above. As shown in FIG. 7D, a first via layer 741 may be fabricated on transistor 731, transistor 733, and photodiodes 721a-n. First via layer 741 may include a plurality of metallic vias 741a-741l. Metallic vias 741a-c may be fabricated on source region 731a, gate region 731b, and drain region 731c of transistor 731, respectively. Metallic vias 741d and 741e may be fabricated on photodiode 721a. Metallic vias 741f and 741g may be fabricated on photodiode 721b. Metallic vias 741h and 741i may be fabricated on photodiode 721n. Metallic vias 741j, 741k, and 741l may be fabricated on source region 733a, gate region 733b, and drain region 733c of transistor 733, respectively. A first metal layer 751 may be fabricated on first via layer 741. First metal layer 751 may include metallic pads 751a-751l that may be fabricated on metallic vias 741a-741l, respectively. In some embodiments, the metallic pads of first metal layer 751 may directly contact the metallic vias of first metallic via layer 741. Each of the interconnect layers 750a may be fabricated by fabricating a dielectric layer (e.g., dielectric layers 761 and 763), patterning the dielectric layer, and depositing suitable metals in the patterned dielectric layer. In some embodiments, via layer 741 and metal layer 751 may be fabricated utilizing a dual-damascene fabrication process.

One or more RRAM devices may be fabricated on the top interconnect layer of first interconnect layers 750a. For example, RRAM devices 735 and 737 may be fabricated on metallic pads 751c and 751h, respectively. It is to be noted that RRAM devices 735 and 737 may be fabricated on any suitable interconnect layer as described herein. RRAM devices 735 and 737 may or may not be fabricated on the same interconnect layer.

Figure 7E:
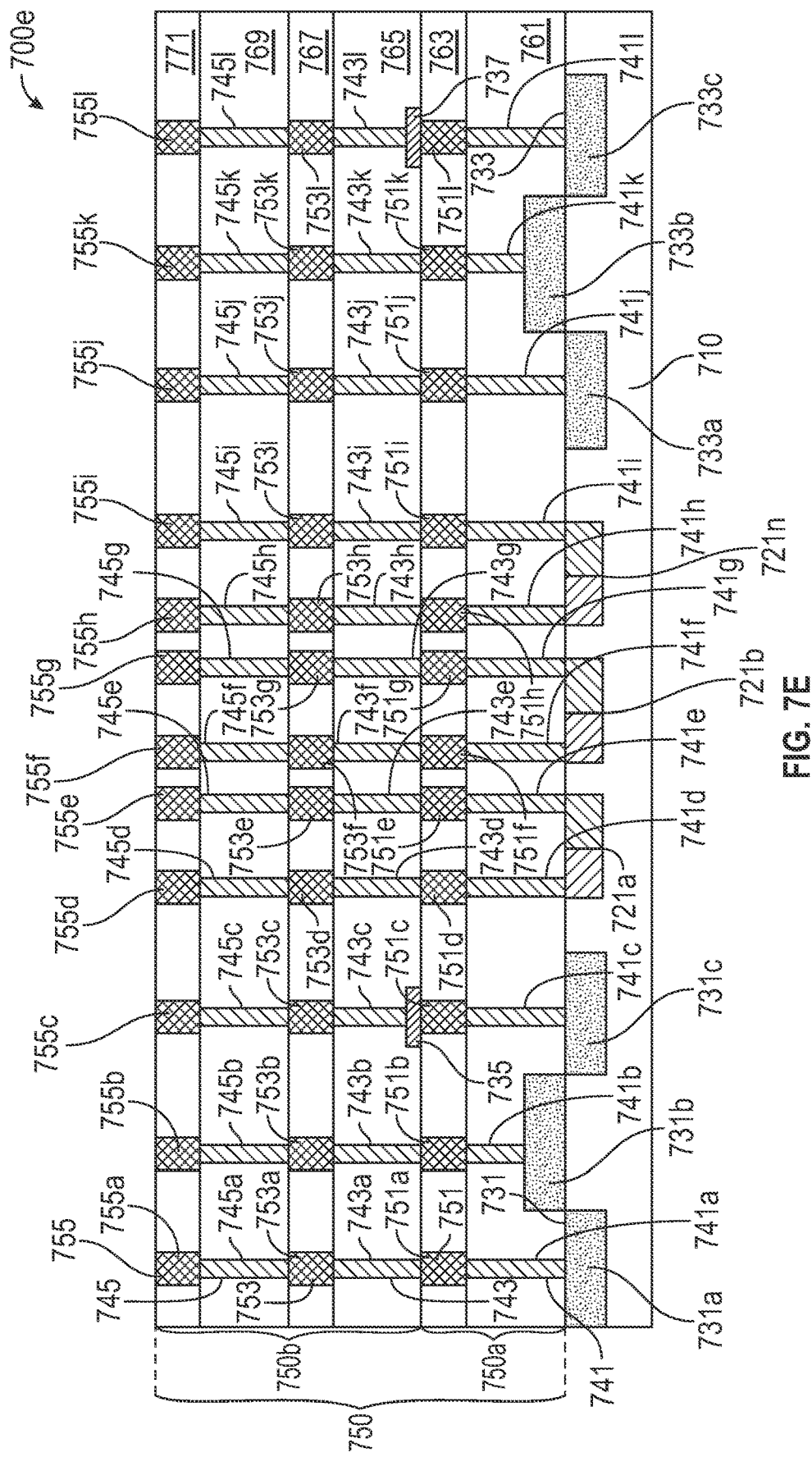

As shown in FIG. 7E, one or more interconnect layers 750b (also referred to as the "second interconnect layers") may be fabricated on RRAMs 735 and 737. Interconnect layers 750a and 750 are also referred to as interconnect layers 750. Each of second interconnect layers 750b may be a metal layer and/or a via layer as described in connection with FIGS. 6A-6B. For example, second interconnect layers 750b may include via layers 743, . . . , 745, and metal layers 753, . . . , 755. The metallic pads 755a-7551 of metal layer 755 may be connected to the metallic pads 753a-7531 of metal layer 753 through metallic vias of metallic vias 745a-7451 of via layer 745, respectively. The metallic pads of metal layers 753 and 751 may be connected through the metallic vias of via layer 743. While certain number of interconnect layers are shown in FIG. 7E, this is merely illustrative. Second interconnect layers 750b may include any suitable number of interconnect layers. Each of second interconnect layers 750b may be fabricated by fabricating a dielectric layer (e.g., dielectric layers 765, 767, 769, and 771), patterning the dielectric layer, and depositing suitable metals in the patterned dielectric layer. In some embodiments, a via layer and a metal layer (e.g., via layer 743 and metal layer 753) may be fabricated utilizing a dual-damascene fabrication process. In some embodiments, one or more through-silicon via (TSV) connections (not shown) may be fabricated with interconnect layers 750 to provide connections between the monolithic wafer and the packaging substrate.

Figure 7F:
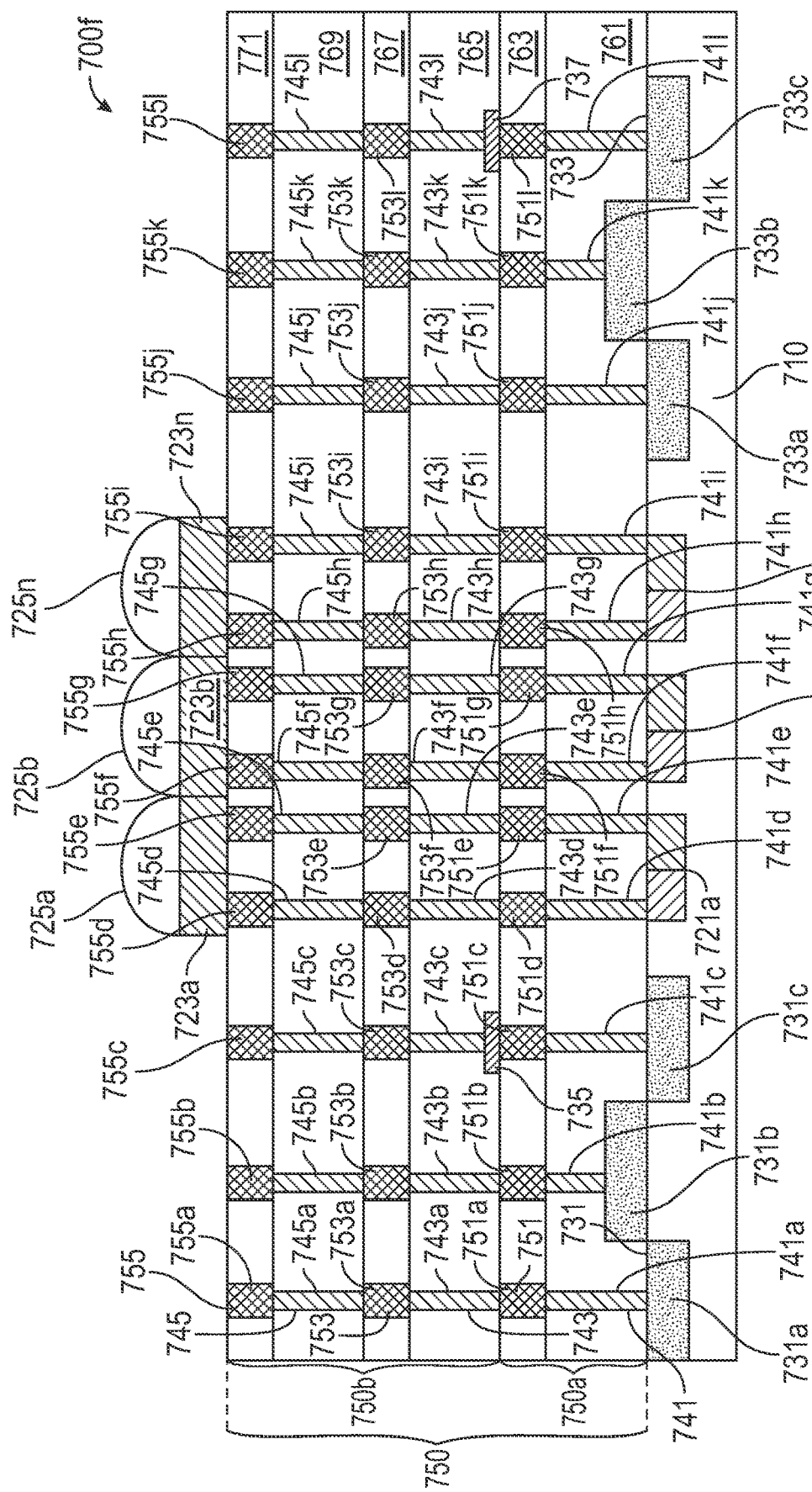

As shown in FIG. 7F, color filters 723a, 723b, . . . , and 723n may be fabricated on second interconnect layers 750b and/or interconnect layers 750. In some embodiments, a set of color filters 723a-n may separate incident light into a plurality of color components. For example, color filters 723a, 723b, and 723n may separate a red component, a green component, and a blue component of the incident light, respectively. Micro lens 725a-n may be fabricated on color filters 723a-n, respectively. While two pairs of micro lens and color filters are shown in FIG. 7F, this is merely illustrative. Any suitable number of color filters and micro lenses may be fabricated on interconnect layers 750.

Figure 7G:
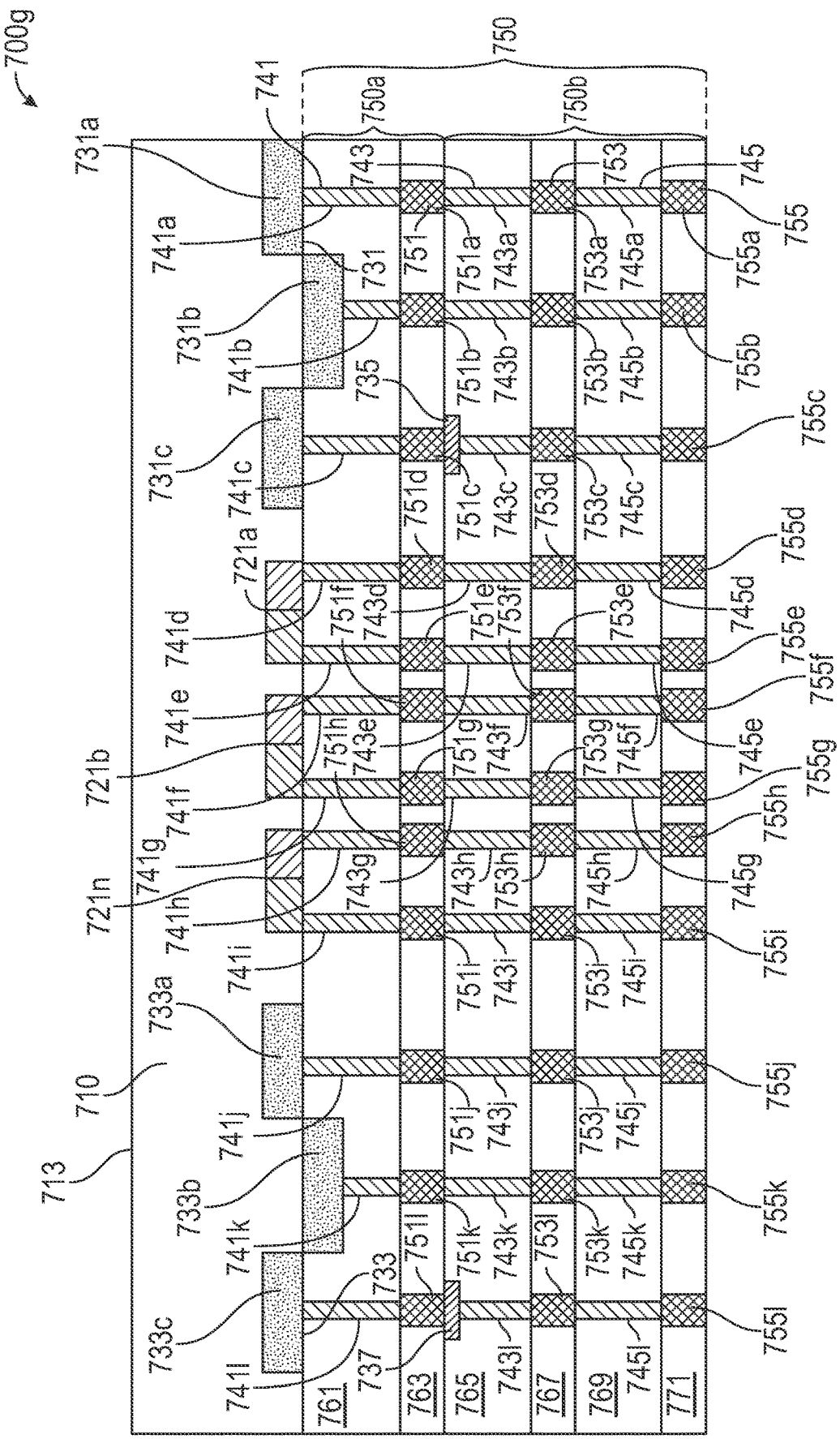
Figure 7H:
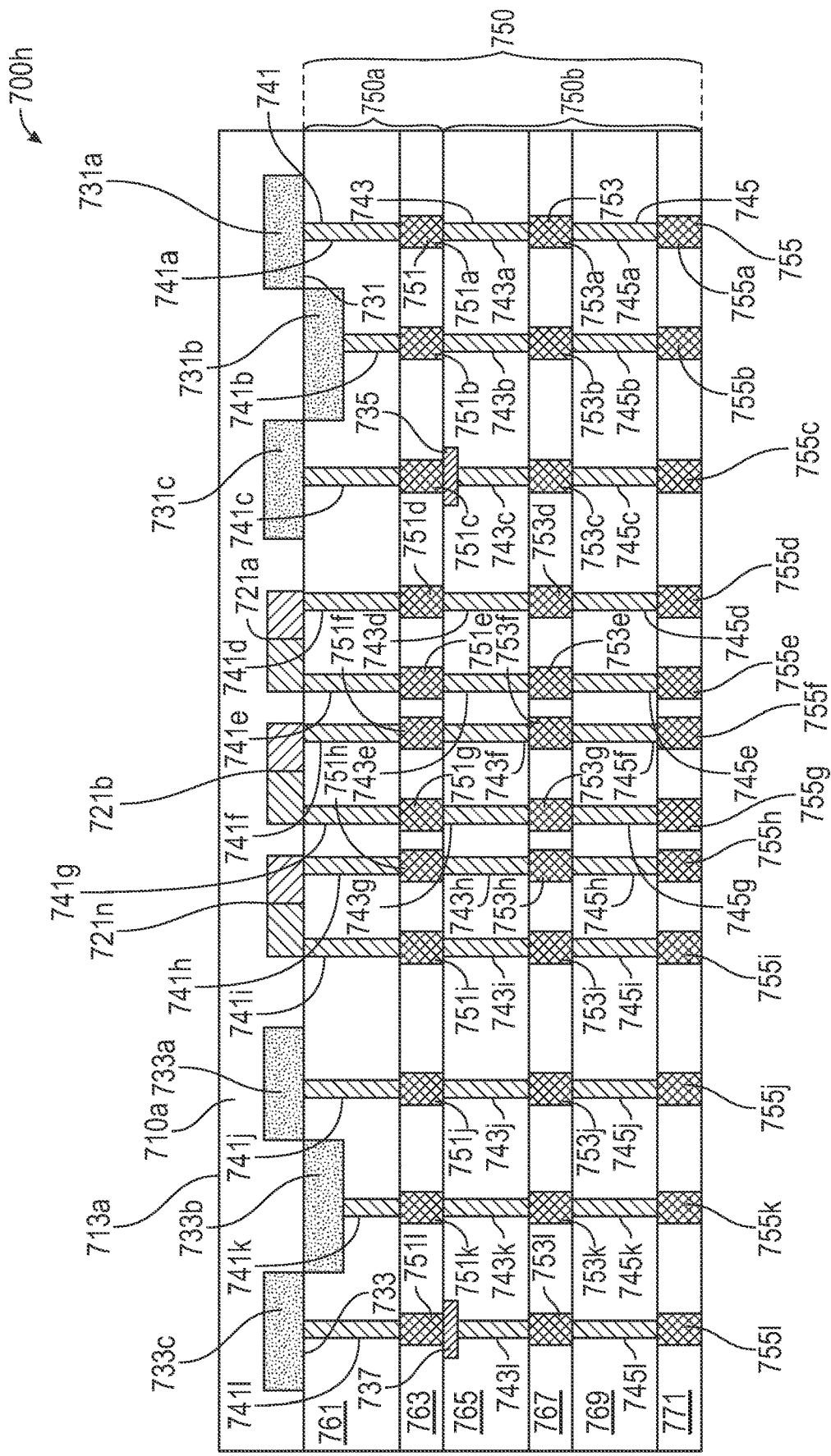
Figure 7I:
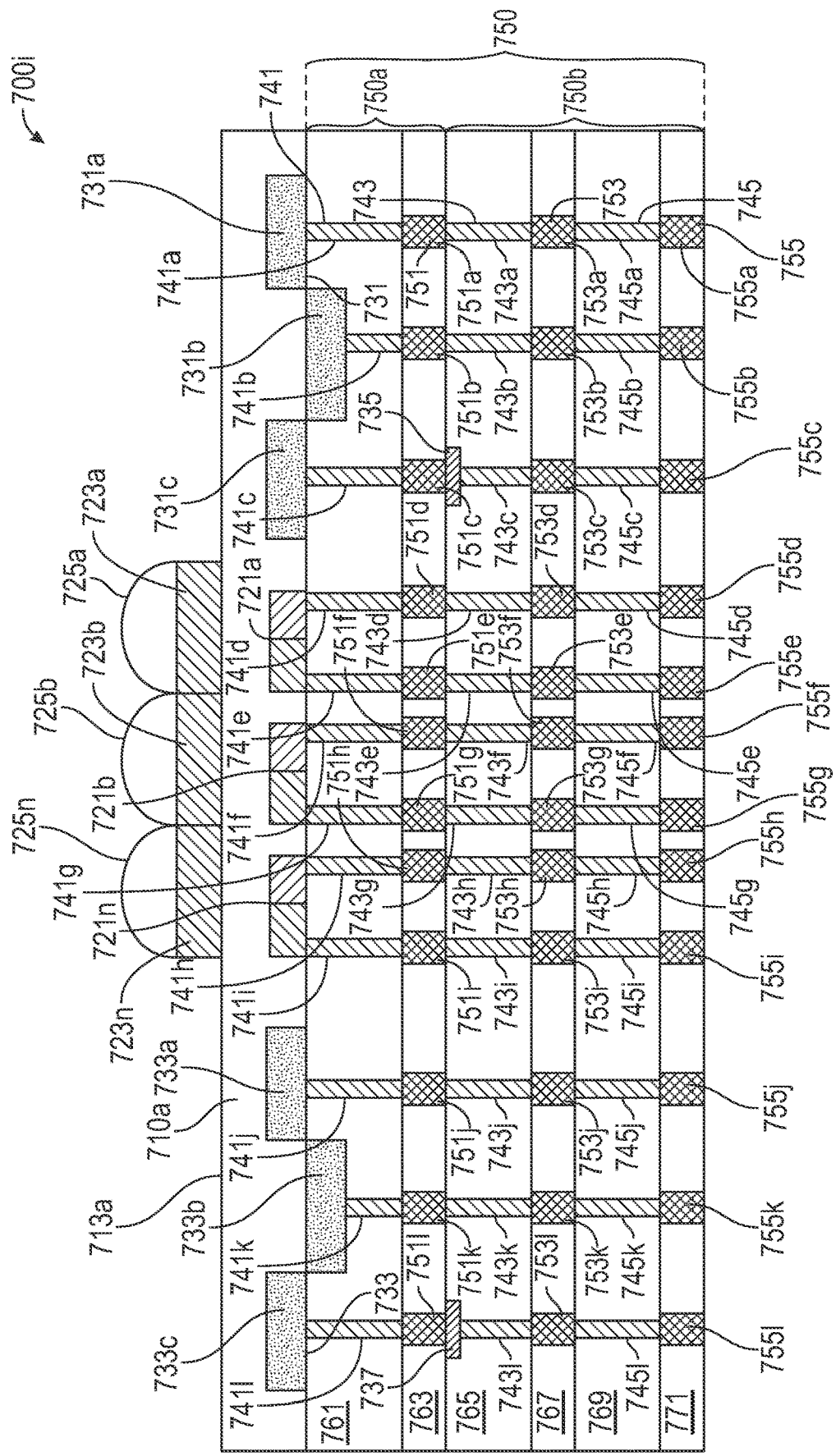

In some embodiments, semiconductor structure 700e of FIG. 7E may be flipped over to fabricate a back-illuminated structure as described in connection with FIG. 5B above. For example, as shown in FIG. 7G, semiconductor structure 700e may be flipped to expose the reverse side (e.g., surface 713) of substrate 710. As shown in FIG. 7H, substrate 710 may be thinned to a suitable thickness to enable incident light to reach the photodiodes. The thinned reverse-side substrate is also referred to as substrate 710a. As shown in FIG. 7I, the color filters 723a-n and micro lens 725a-n may be fabricated on a surface 713a of substrate 710a. Surfaces 713a and 711 correspond to two opposite sides of substrate 710.

Figure 8A:
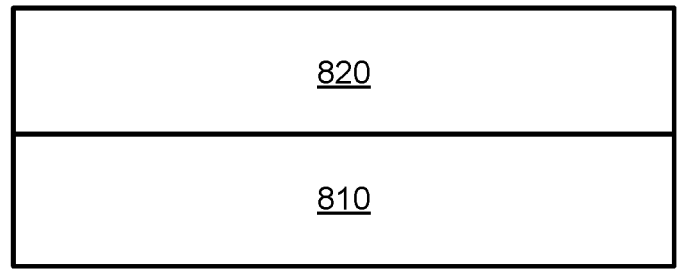
FIGS. 8A and 8B are schematic diagrams illustrating cross-sectional views of an example monolithic wafer with integrated sensing and processing capabilities in accordance with some embodiments of the present disclosure.
Figure 8B:
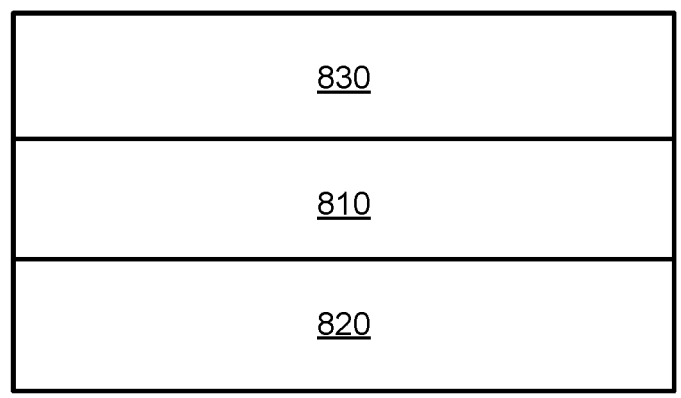

FIGS. 8A-8B are schematic diagrams illustrating cross-sectional views of an example monolithic wafer with integrated sensing and processing capabilities in accordance with some embodiments of the present disclosure.

Referring to FIG. 8A, ML processor 820 may be fabricated on a substrate 810. The substrate 810 may be a single crystal silicon substrate in some embodiments. Substrate 810 may then be flipped over, and sensing module 830 may be fabricated on a second side of substrate 810. As such, ML processor 820 and sensing module 830 may be fabricated on different sides (e.g., opposite sides) of substrate 810 utilizing dual-side wafer processing and/or double-sided wafer processing techniques. Substrate 810 may be a dual-side polished semiconductor wafer (e.g., a silicon wafer) with two polished surfaces and/or sides suitable for fabricating the CMOS circuits and sensing modules as described herein. For example, multiple CMOS circuits (e.g., CMOS circuits 600a and/or 600b of FIGS. 6A-6B) may be fabricated on the first side of substrate 810 to implement crossbar arrays and other components of ML processors 120 and/or 140 of FIGS. 1A-1B. Sensing module 830 may be fabricated on a second side of substrate 810 shown in FIG. 8B. Sensing module 830 may include one or more sensors fabricated on the second side of substrate 810. In some embodiments, sensing module 830 may include photodiodes, color filters, one or more interconnect layers, micro lenses, and any other suitable components for implementing image sensor arrays as described herein. For example, sensing module 830 may include one or more sensor wafers 500a-b as described in connection with FIGS. 5A-5B.

FIGS. 8C, 8D, 8E, and 8F are diagrams illustrating cross-sections of example structures 800c, 800d, 800e, and 800f for fabricating the monolithic wafer as described in connection with FIGS. 8A-8B in accordance with some embodiments of the present disclosure.

Figure 8C:
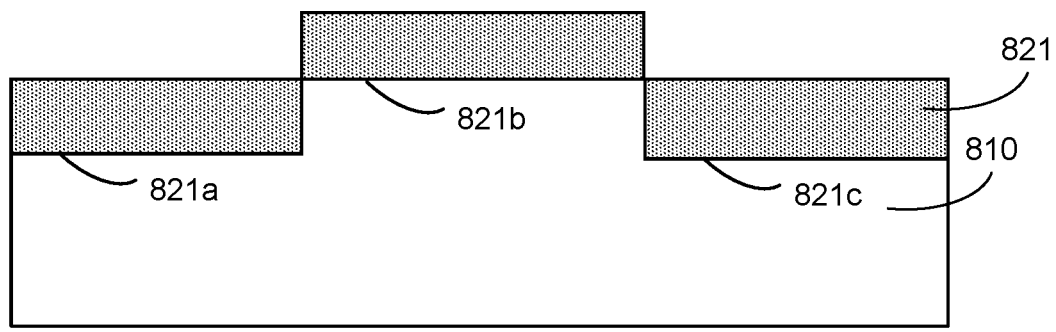
FIGS. 8C, 8D, 8E, and 8F are diagrams illustrating cross-sectional views of example structures for fabricating the monolithic wafer described in connection with FIGS. 8A-8B in accordance with some embodiments of the present disclosure.
Figure 8D:
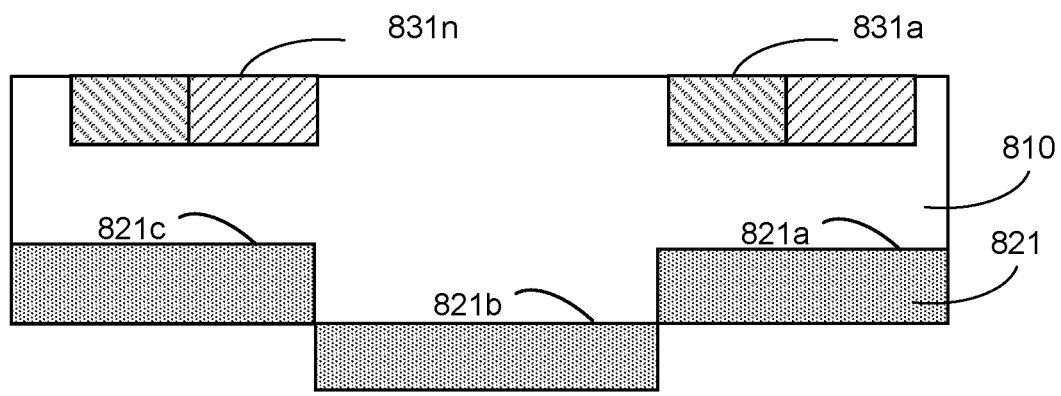

To fabricate the monolithic wafer, the transistors of ML processor 820 and the photodiodes of sensing module 830 may first be fabricated on substrate 810, as the fabrication of the transistors and photodiodes may involve high-temperature processes (e.g., thermal oxidation, ion implantation, diffusion, etc.). For example, as shown in FIG. 8C, a transistor 821 may be fabricated on substrate 810. Transistor 821 may include a source region 821a, a gate 821b, and a drain region 821c. Substrate 810 may be flipped over to expose a second surface of substrate 810 (e.g., the reverse side). As shown in FIG. 8D, one or more photodiodes 831a-831n may then be fabricated on the second surface of substrate 810. While a certain number of transistors and photodiodes are shown in FIGS. 8C-8D, this is merely illustrative. Any suitable number of transistors and photodiodes may be fabricated on substrate 810 to implement an ML processor as described herein.

Figure 8E:
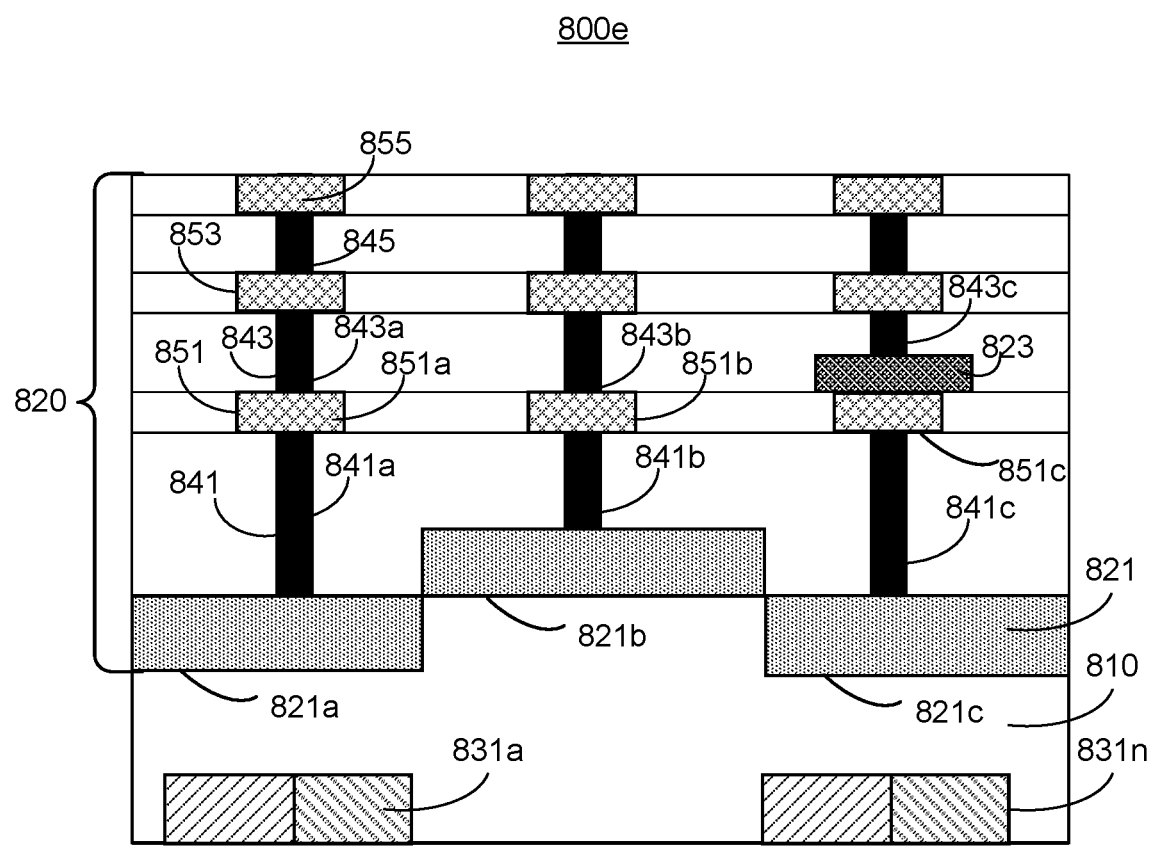

Referring to FIG. 8E, one or more interconnect layers (also referred to as the first plurality of interconnect layers) may be fabricated on transistor 821. The first plurality of interconnect layers may include metal layers 851, 853, . . . , 855 and via layers 841, 843, . . . , 845. Each of the first plurality of interconnect layers may be an interconnect layer as described in connection with FIGS. 6A-6B above. Via layer 841 may include metallic vias 841a, 841b, and 841c that are connected to the source region 821a, the gate 821b, and the drain region 821c of transistor 821, respectively. Metal layer 851 may include metallic pads 851a, 851b, and 851c that are connected to metallic vias 841a, 841b, and 841c, respectively. The first plurality of interconnect layers may include any suitable number of metal layers and via layers. An RRAM device 823 may be fabricated during the fabrication of the interconnect layers. For example, RRAM device 823 may be fabricated on metallic pad 851c of metal layer 851. A metallic via 843c of via layer 843 may be fabricated on RRAM device 823. Metallic vias 843a and 843b of via layer 843 may be connected to metallic pads of 851a and 851b of metal layer 851, respectively. In some embodiments, RRAM device 823 may be fabricated on a metallic pad and/or metallic via connected to the source region of transistor 821.

Figure 8F:
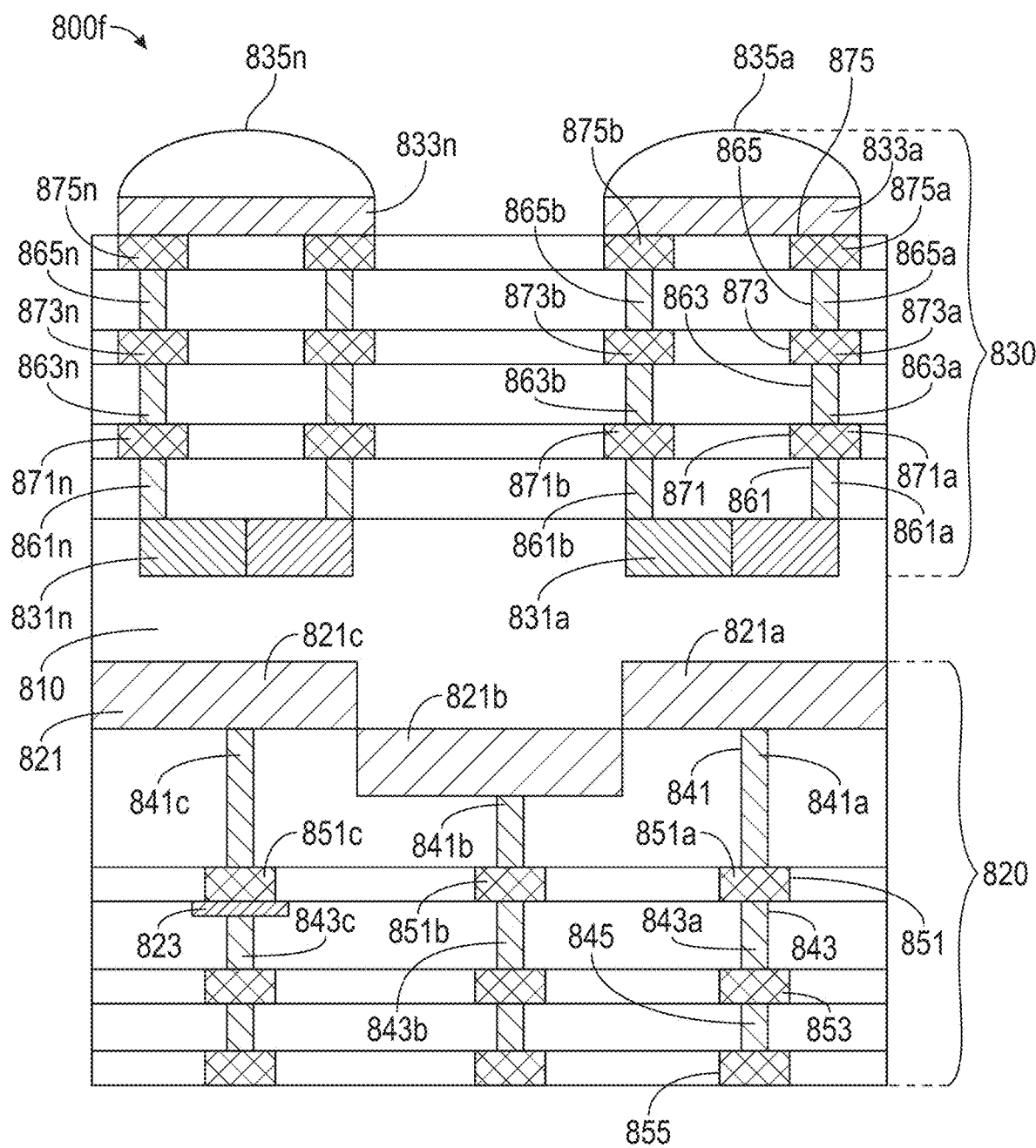

Referring to FIG. 8F, a plurality of interconnect layers (also referred to as the "second plurality of interconnect layers") may be fabricated on photodiodes 831a-n. The second plurality of interconnect layers may include, for example, via layers 861, 863, . . . , 865 and metal layers 871, 873, . . . , 875. Via layer 861 may include metallic vias 861a, 861b, . . . , 861n that are fabricated on photodiodes 831a-n. Metal layer 871 may include metallic pads 871a, 871b, . . . , 871n that are fabricated on metallic vias 861a, 861b, . . . , 861n, respectively. Metallic pads 875a, 875b, . . . , 875n may be connected to metallic pads 873a, 873b, . . . , 873n of metal layer 873 through metallic vias 865a, 865b, . . . , 865n of via layer 865. Metallic pads 873a, 873b, . . . , 873n may be connected to metallic pads 871a, 871b, . . . , 871n of metal layer 871 through metallic vias 863a, 863b, . . . , 863n of via layer 863. The second plurality of interconnect layers may include any suitable number of metal layers and via layers. Color filters 833a-n may be fabricated on the second plurality of interconnect layers (e.g., metallic pads 875a, 875b, . . . , and 875n of metal layer 875). Micro lenses 835a-n may be fabricated on color filters 833a-n, respectively. In some embodiments, through silicon vias (not shown) may be fabricated to connect ML processor 820 to sensing module 830.

Figure 9A:
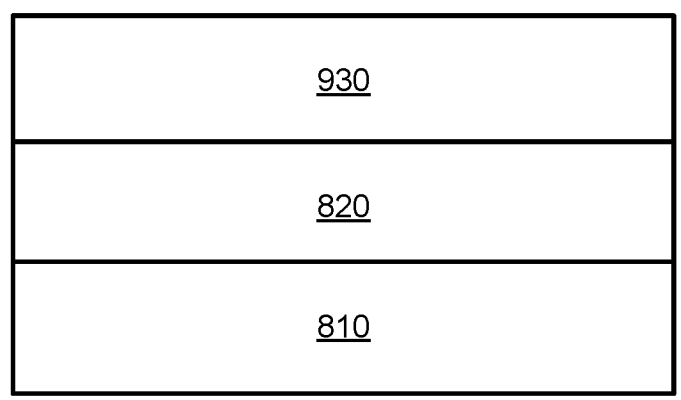
FIG. 9A is a schematic diagram illustrating a cross-section of an example monolithic wafer with integrated sensing and processing capabilities in accordance with some embodiments of the present disclosure.
Figure 9B:
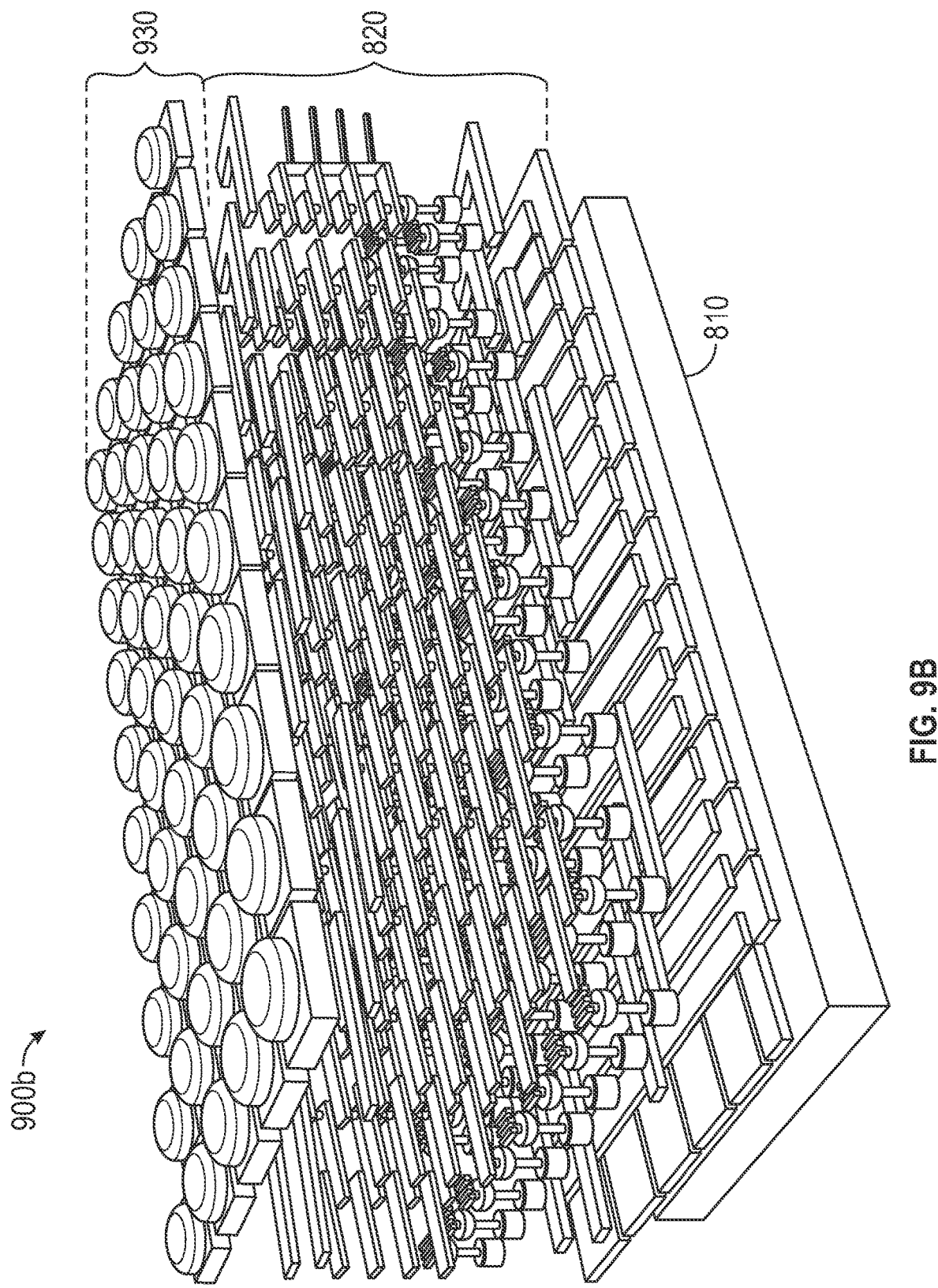
FIG. 9B is a schematic diagram illustrating the example monolithic wafer as shown in FIG. 9A.

In some embodiments, the sensing module may be fabricated on ML processor 820. For example, as shown in FIGS. 9A-9B, ML processor 820 may be fabricated on substrate 810 as described above in connection with FIG. 8A. A sensing module 930 may be fabricated on ML processor 820. The sensing module 930 may include one or more photodiodes fabricated on an interconnect layer of the ML processor 820, such as one or more amorphous Si (a-Si) photodiodes, polysilicon (poli-Si) photodiodes, and/or any other suitable photodiodes and/or sensors that may be fabricated on a CMOS circuit as described herein. The sensing module 930 may further include color filters, micro lenses, and/or any other suitable components fabricated on the photodiodes. The size of the monolithic wafer may thus be further reduced as the sensing module may be stacked on the ML processor by depositing a-Si photodiodes, poli-Si photodiodes, etc. over the ML processor.

For simplicity of explanation, the methods of this disclosure are depicted and described as a series of acts. However, acts in accordance with this disclosure can occur in various orders and/or concurrently, and with other acts not presented and described herein. Furthermore, not all illustrated acts may be required to implement the methods in accordance with the disclosed subject matter. In addition, those skilled in the art will understand and appreciate that the methods could alternatively be represented as a series of interrelated states via a state diagram or events.

The terms "approximately," "about," and "substantially" as used herein may mean within a range of normal tolerance in the art, such as within 2 standard deviations of the mean, within ±20% of a target dimension in some embodiments, within ±10% of a target dimension in some embodiments, within ±5% of a target dimension in some embodiments, within ±2% of a target dimension in some embodiments, within ±1% of a target dimension in some embodiments, and yet within ±0.1% of a target dimension in some embodiments. The terms "approximately" and "about" may include the target dimension. Unless specifically stated or obvious from context, all numerical values described herein are modified by the term "about."

As used herein, a range includes all the values within the range. For example, a range of 1 to 10 may include any number, combination of numbers, sub-range from the numbers of 1, 2, 3, 4, 5, 6, 7, 8, 9, and 10 and fractions thereof.

In the foregoing description, numerous details are set forth. It will be apparent, however, that the disclosure may be practiced without these specific details. In some instances, well-known structures and devices are shown in block diagram form, rather than in detail, in order to avoid obscuring the disclosure.

The terms "first," "second," "third," "fourth," etc. as used herein are meant as labels to distinguish among different elements and may not necessarily have an ordinal meaning according to their numerical designation.

The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Reference throughout this specification to "an implementation" or "one implementation" means that a particular feature, structure, or characteristic described in connection with the implementation is included in at least one implementation. Thus, the appearances of the phrase "an implementation" or "one implementation" in various places throughout this specification are not necessarily all referring to the same implementation.

As used herein, when an element or layer is referred to as being "on" another element or layer, the element or layer may be directly on the other element or layer, or intervening elements or layers may be present. In contrast, when an element or layer is referred to as being "directly on" another element or layer, there are no intervening elements or layers present.

Whereas many alterations and modifications of the disclosure will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims, which in themselves recite only those features regarded as the disclosure.

What is claimed is:

1. A semiconductor device, comprising:
   a sensing module configured to generate a plurality of analog sensing signals; and
   a machine learning (ML) processor, comprising:
   one or more crossbar arrays configured to process the analog sensing signals to generate analog preprocessed sensing data;
   an analog-to-digital converter (ADC) configured to convert the analog preprocessed sensing data into digital preprocessed sensing data; and
   a machine learning processing unit configured to process the digital preprocessed sensing data utilizing one or more machine learning models, wherein the sensing module and the ML processor are fabricated on a single wafer, wherein the sensing module is fabricated on a first portion of the wafer, and wherein the ML processor is fabricated on a second portion of the wafer that surrounds the first portion of the wafer.

2. The semiconductor device of claim 1, wherein the sensing module and the ML processor are fabricated on the same side of the wafer.

3. The semiconductor device of claim 2, wherein a plurality of transistors of the ML processor and a plurality of sensors of the sensing module are fabricated on a substrate of the wafer, and wherein the semiconductor device further comprises a plurality of interconnect layers fabricated on the plurality of transistors and the plurality of sensors.

4. The semiconductor device of claim 3, wherein the plurality of sensors comprises a plurality of photodiodes, wherein a first metallic via, a second metallic via, and a third metallic via of a first interconnect layer are connected to a source region, a gate region, and a drain region of a first transistor of the plurality of transistors, respectively, and wherein a fourth metallic via and a fifth metallic via of the first interconnect layer are connected to a first photodiode of the plurality of photodiodes.

5. The semiconductor device of claim 4, wherein a resistive random-access memory (RRAM) device of the ML processor is fabricated on a metallic pad or metallic via of an interconnect layer of the plurality of interconnect layers, and wherein the RRAM device is connected to the first transistor through the first interconnect layer.

6. The semiconductor device of claim 5, wherein a micro lens and a set of color filters of the sensing module are fabricated on the plurality of interconnect layers.

7. The semiconductor device of claim 2, wherein the sensing module is fabricated on the ML processor.

8. The semiconductor device of claim 1, wherein the sensing module and the ML processor are fabricated on different sides of the wafer.

9. The semiconductor device of claim 1, wherein the sensing module comprises an array of image sensors, wherein the plurality of analog sensing signals comprises a plurality of analog image signals.

10. The semiconductor device of claim 1, wherein the analog preprocessed sensing data correspond to a plurality of features extracted from the analog sensing signals, and wherein the machine learning processing unit performs machine learning using the extracted features.

11. The semiconductor device of claim 1, further comprising a packaging substrate, wherein the wafer is connected to the packaging substrate through an interconnect layer.

12. The semiconductor device of claim 1, wherein the ML processor is powered utilizing the analog sensing signals.

13. The semiconductor device of claim 1, further comprising a transceiver configured to:
   transmit, to a computing device, a predictive output generated by the machine learning processing unit based on the one or more machine learning models; and
   receive, from the computing device, instructions for performing operations based on the predictive output.

14. The semiconductor device of claim 1, wherein the analog preprocessed sensing data represents a convolution of the analog sensing signals and a kernel.

15. The semiconductor device of claim 14, wherein conductance values of a plurality of cross-point devices of the one or more crossbar arrays are programmed to values representing the kernel.

16. The semiconductor device of claim 1, wherein the sensing module comprises a two-dimensional sensor array, wherein a plurality of cross-point devices of the one or more crossbar arrays is configured to receive the analog sensing signals produced by the two-dimensional sensor array as input.

17. The semiconductor device of claim 16, wherein the one or more crossbar arrays comprises a plurality of crossbar arrays positioned on a plurality of different planes.

18. A semiconductor device, comprising:
   a sensing module configured to generate a plurality of analog sensing signals; and
   a machine learning processor configured to produce a predictive output by processing the plurality of analog sensing signals using one or more machine learning models, wherein the machine learning processor comprises:
      a plurality of crossbar arrays configured to generate a plurality of analog outputs representative of the predictive output; and
      an analog-to-digital converter unit configured to convert the plurality of analog outputs representative of the predictive output into a plurality of digital signals representative of the predictive output, wherein the sensing module and the machine learning processor are fabricated on a wafer, wherein the sensing module is fabricated on a first portion of the wafer, and wherein the machine learning processor is fabricated on a second portion of the wafer that surrounds the first portion of the wafer.

19. The semiconductor device of claim 18, further comprising a packaging substrate, wherein the wafer is connected to the packaging substrate through an interconnect layer.

* * * * *